US012776264B2

(12) United States Patent
Liu et al.

(10) Patent No.: US 12,776,264 B2
(45) Date of Patent: Oct. 27, 2026

(54) DISPLAY SUBSTRATE AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Biao Liu, Beijing (CN); Tinghua Shang, Beijing (CN); Huijuan Yang, Beijing (CN); Hongwei Ma, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 610 days.

(21) Appl. No.: 17/758,085

(22) PCT Filed: Sep. 2, 2021

(86) PCT No.: PCT/CN2021/116217

§ 371 (c)(1),
(2) Date: Jun. 28, 2022

(87) PCT Pub. No.: WO2023/028944

PCT Pub. Date: Mar. 9, 2023

(65) Prior Publication Data

US 2024/0177659 A1 May 30, 2024

(51) Int. Cl.
*G09G 3/32* (2016.01)
*G09G 3/3233* (2016.01)
(Continued)

(52) U.S. Cl.
CPC ....... *G09G 3/3233* (2013.01); *H10K 59/1213* (2023.02); *H10K 59/126* (2023.02);
(Continued)

(58) Field of Classification Search
CPC ........... G09G 3/3233; G09G 2310/061; G09G 2320/0233; G09G 2330/021;
(Continued)

(56) References Cited

U.S. PATENT DOCUMENTS

| | | | | |
|---|---|---|---|---|
| 10,991,303 | B2 * | 4/2021 | Lee ........................ | G09G 3/325 |
| 11,721,282 | B2 | 8/2023 | Wei et al. | |

(Continued)

FOREIGN PATENT DOCUMENTS

| | | | |
|---|---|---|---|
| CN | 110675816 A | 1/2020 | |
| CN | 210535236 U | 5/2020 | |

(Continued)

OTHER PUBLICATIONS

Extended European Search Report, mailed Mar. 12, 2024, from EP Application No. 21955484.7, 11 pages.

*Primary Examiner* — Chanh D Nguyen
*Assistant Examiner* — Jarurat Suteerawongsa
(74) *Attorney, Agent, or Firm* — Workman Nydegger

(57) ABSTRACT

A display substrate and a display apparatus are provided. The display substrate includes a plurality of sub-pixels, and pixel driving circuits of sub-pixels form M pixel rows and N pixel columns; the display substrate includes a first initialization signal line and a second initialization signal line; the pixel driving circuits include a plurality of transistors and a light-emitting device, and the transistors include driving transistors; the light-emitting device includes a first electrode, wherein the first initialization signal line is respectively electrically connected with the $m^{th}$ row of sub-pixels, and is configured to transmit a first initialization signal to a control electrode of a driving transistor of the $m^{th}$ row of sub-pixels; the second initialization signal line is respectively electrically connected with the $(m-1)^{th}$ row of sub-pixels, and is configured to transmit a second initialization
(Continued)

signal to a first electrode of a light-emitting device of the $(m-1)^{th}$ row of sub-pixels.

19 Claims, 22 Drawing Sheets

(51) Int. Cl.

| | |
|---|---|
| ***H10K 59/121*** | (2023.01) |
| ***H10K 59/126*** | (2023.01) |
| ***H10K 59/131*** | (2023.01) |
| ***H10K 59/35*** | (2023.01) |

(52) U.S. Cl.
CPC ......... *H10K 59/1315* (2023.02); *H10K 59/35* (2023.02); *G09G 2310/061* (2013.01); *G09G 2320/0233* (2013.01); *G09G 2330/021* (2013.01)

(58) Field of Classification Search
CPC ... G09G 2300/0426; G09G 2300/0452; G09G 2300/0819; G09G 2300/0842; G09G 2300/0861; G09G 2310/0251; G09G 2310/0262; G09G 3/32; H10K 59/1213; H10K 59/126; H10K 59/1315; H10K 59/35; H10K 59/12; H10K 59/131; H10D 86/423; H10D 86/60; H10D 86/441
See application file for complete search history.

(56) References Cited

U.S. PATENT DOCUMENTS

| | | | | |
|---|---|---|---|---|
| 2014/0299843 | A1* | 10/2014 | Kim | H10K 59/131 438/23 |
| 2015/0241501 | A1* | 8/2015 | Jang | G09G 3/006 324/527 |
| 2019/0206966 | A1* | 7/2019 | Kim | H10K 59/1213 |
| 2020/0265786 | A1* | 8/2020 | Li | G09G 3/3266 |
| 2021/0202612 | A1* | 7/2021 | Jung | H10K 59/1213 |
| 2021/0241696 | A1* | 8/2021 | Cho | G09G 3/3291 |
| 2021/0272985 | A1* | 9/2021 | Kim | G09G 3/32 |
| 2021/0335989 | A1 | 10/2021 | Diao et al. | |
| 2021/0384289 | A1* | 12/2021 | Li | G09G 3/3233 |
| 2022/0199747 | A1* | 6/2022 | Jung | H10K 59/123 |
| 2022/0238067 | A1* | 7/2022 | Park | G09G 3/32 |
| 2022/0320215 | A1* | 10/2022 | Lee | H10K 59/1213 |
| 2022/0327998 | A1* | 10/2022 | Liu | G09G 3/3266 |
| 2023/0038017 | A1* | 2/2023 | Wei | H10K 59/131 |

FOREIGN PATENT DOCUMENTS

| | | | |
|---|---|---|---|
| CN | 113035925 | A | 6/2021 |
| CN | 113261106 | A | 8/2021 |
| CN | 113314039 | A | 8/2021 |
| CN | 113471264 | A | 10/2021 |
| WO | 2021102905 | A1 | 6/2021 |

* cited by examiner

DISPLAY SUBSTRATE AND DISPLAY APPARATUS

CROSS REFERENCE TO RELATED APPLICATIONS

The present disclosure is a US National Stage of International Application No. PCT/CN2021/116217, filed on Sep. 2, 2021, the entire contents of which are incorporated herein by reference.

FIELD

The present disclosure relates to, but not limited to, the field of display, in particular to a display substrate and a display apparatus.

BACKGROUND

An Organic Light Emitting Diode (OLED) and a Quantum-dot Light Emitting Diode (QLED) are active light-emitting display devices and have advantages of self-illumination, wide viewing angle, high contrast, low power consumption, extremely high response speed, lightness and thinness, bendability, and so on. With constant development of display technologies, a flexible display apparatus using the OLED or the QLED as a light-emitting device and employing a Thin Film Transistor (TFT) for signal control has become a mainstream product in the current display field. The ever-increasing demand for image quality also poses new challenges for development of current OLED and QLED technologies.

SUMMARY

On the one hand, an embodiment of the present disclosure provides a display substrate, including: a base substrate; and a plurality of sub-pixels arranged in an array, wherein at least one of the plurality of sub-pixels includes a pixel driving circuit and a light-emitting device, the plurality of sub-pixels form an array of M rows*N columns, and M and N are positive integers greater than or equal to 1: the pixel driving circuit includes a plurality of transistors, and the plurality of transistors include driving transistors; and the light-emitting device includes a first electrode.

The base substrate includes: a first initialization signal line and a second initialization signal line; and the first initialization signal line and the second initialization signal line extend in a first direction, and the first direction is an extension direction of sub-pixel rows; wherein the first initialization signal line is respectively electrically connected with a $m^{th}$ row of sub-pixels, and is configured to transmit a first initialization signal to a control electrode of a driving transistor of the $m^{th}$ row of sub-pixels; and the second initialization signal line is respectively electrically connected with a $(m-1)^{th}$ row of sub-pixels, and is configured to transmit a second initialization signal to a first electrode of a light-emitting device of the $(m-1)^{th}$ row of sub-pixels; in a second direction, a projection of the first initialization signal line on the base substrate is located on one side of a projection of the second initialization signal line on the base substrate close to a projection of the $(m-1)^{th}$ row of sub-pixels on the base substrate, the second direction is an extension direction of sub-pixel columns, and m is a positive integer greater than or equal to 1 and less than or equal to M; and the first initialization signal is different from the second initialization signal.

Optionally, the first initialization signal line and the second initialization signal line are located between driving transistors of two adjacent rows of sub-pixels, and located on a same side of any row of driving transistors in the second direction.

Optionally, in the second direction, a width of the first initialization signal line is different from a width of the second initialization signal line.

Optionally, in the second direction, the width of the second initialization signal line is greater than the width of the first initialization signal line.

Optionally, in the second direction, the width of the second initialization signal line is 1.3-2.4 times the width of the first initialization signal line.

Optionally, the display substrate further includes: a reset signal line, wherein the reset signal line extends in the first direction and is configured to transmit a reset signal to the pixel driving circuit; the plurality of transistors further include: a first reset transistor and a second reset transistor; and the first reset transistor is configured to transmit the first initialization signal on the first initialization signal line to the control electrode of the driving transistor of the $m^{th}$ row of sub-pixels under control of the reset signal; and the second reset transistor is configured to transmit the second initialization signal on the second initialization signal line to the first electrode of the light-emitting device of the $(m-1)^{th}$ row of sub-pixels under control of the reset signal.

Optionally, in the second direction, the reset signal line, the second initialization signal line, and the first initialization signal line are arranged in sequence in a direction away from the driving transistor of the $m^{th}$ row of sub-pixels.

Optionally; in a direction perpendicular to the display substrate, a driving circuit layer includes a semiconductor layer, a first conductive layer, a second conductive layer, a third conductive layer and a fourth conductive layer disposed on the base substrate in sequence; and the semiconductor layer includes an active layer of the plurality of transistors, and the active layer includes channel regions and source-drain regions of the transistors; the first conductive layer includes a reset signal line and control electrodes of the transistors; the second conductive layer includes the first initialization signal line and the second initialization signal line; and the third conductive layer includes a first power supply line, and the fourth conductive layer includes a second power supply line and a data signal line.

Optionally; the display substrate further includes: a third initialization signal line extending in the second direction, wherein the third initialization signal line and the first initialization signal line are disposed in different layers, and the third initialization signal line is electrically connected with the first initialization signal line or the second initialization signal line.

Optionally, the third conductive layer further includes the third initialization signal line.

Optionally, the third initialization signal line and the first initialization signal line are electrically connected and distributed in a mesh shape.

Optionally, the at least one column of sub-pixels is disposed between the adjacent third initialization signal lines.

Optionally, the at least two first power supply lines are disposed between the adjacent third initialization signal lines.

Optionally, the plurality of sub-pixels include red sub-pixels emitting red light, blue sub-pixels emitting blue light, and green sub-pixels emitting green light, and the plurality of sub-pixel columns include red-blue pixel columns and green pixel columns; the red-blue pixel columns include the red sub-pixels and the blue sub-pixels disposed alternately in the second direction; the green pixel columns include the green sub-pixels disposed in sequence in the second direction; and the third initialization signal line is located in the red-blue pixel columns.

Optionally, a shape of the third initialization signal line electrically connected with the $n^{th}$ column of red-blue pixel columns is the same as a shape of the third initialization signal line electrically connected with the (n+1)th column of red-blue pixel columns, and n is a positive integer greater than or equal to 1 and less than or equal to N.

Optionally, the third initialization signal line includes a first extension portion, a second extension portion and a third extension portion connected in sequence in the second direction. The first extension portion extends in the second direction and is electrically connected with the first initialization signal line through a via hole. An extension direction of the third extension portion is different from an extension direction of the first extension portion, the second extension portion is configured to connect the first extension portion with the third extension portion, and an extension direction of the second extension portion deviates from the second direction.

Optionally, a projection of the first extension portion on the base substrate has an overlapped region with projections of the reset signal line, the first initialization signal line and the second initialization signal line on the base substrate.

Optionally, the first extension portion is connected with a first pole of a first transistor through a via hole.

Optionally, the second extension portion and the first extension portion form an angle greater than 90° and less than 180°; and the third extension portion and the second extension portion form an angle greater than 90° and less than 180°.

Optionally, the plurality of transistors further include: a second transistor, a first pole of the second transistor is electrically connected with a second pole of the driving transistor, and a second pole of the second transistor is electrically connected with the control electrode of the driving transistor; and the second conductive layer further includes: a shielding portion, the shielding portion is electrically connected with the first power supply line, a projection of the shielding portion on the base substrate covers at least part of a source-drain region of the second transistor, and the projection of the shielding portion on the base substrate and a projection of the data signal line on the base substrate are located between the projections of the adjacent data signal lines on the base substrate.

Optionally, the third conductive layer further includes a fourth connection portion and a fifth connection portion, the fourth conductive layer further includes a seventh connection portion, the seventh connection portion is electrically connected with the fourth connection portion and the fifth connection portion. The fourth connection portion and the fifth connection portion are different in shape.

On the other hand, an embodiment of the present disclosure further provides a display apparatus, including the display substrate according to any one of the aforementioned embodiments.

In the display substrate and the display apparatus according to the embodiments of the present disclosure, a gate of the driving transistor of the $m^{th}$ row of sub-pixels is reset by adopting the first initialization signal line, and a first electrode of a light-emitting element of the $(m-1)^{th}$ row of sub-pixels is reset by adopting the second initialization signal line, and the first initialization signal and the second initialization signal are different signals, so that the gate of the driving transistor and the first electrode of the light-emitting element are reset better, and thus in a black state, an OLED display substrate can be guaranteed to have lower brightness to improve display uniformity. In addition, the embodiments of the present disclosure further provide the display substrate and the display apparatus, which have the third initialization signal lines distributed in a specific pixel column, and the third initialization signal lines and the first initialization signal line or the second initialization signal line are electrically connected in a mesh shape, thereby significantly reducing impedance of the initialization signal lines and improving picture quality.

BRIEF DESCRIPTION OF THE DRAWINGS

Accompanying drawings are configured to provide a further understanding of technical solutions of the present disclosure, constitute a part of the specification, are configured to explain the technical solutions of the present disclosure together with embodiments of the present disclosure, and do not limit the technical solutions of the present disclosure.

EXPLANATION OF REFERENCE NUMERALS

Figure 1A:
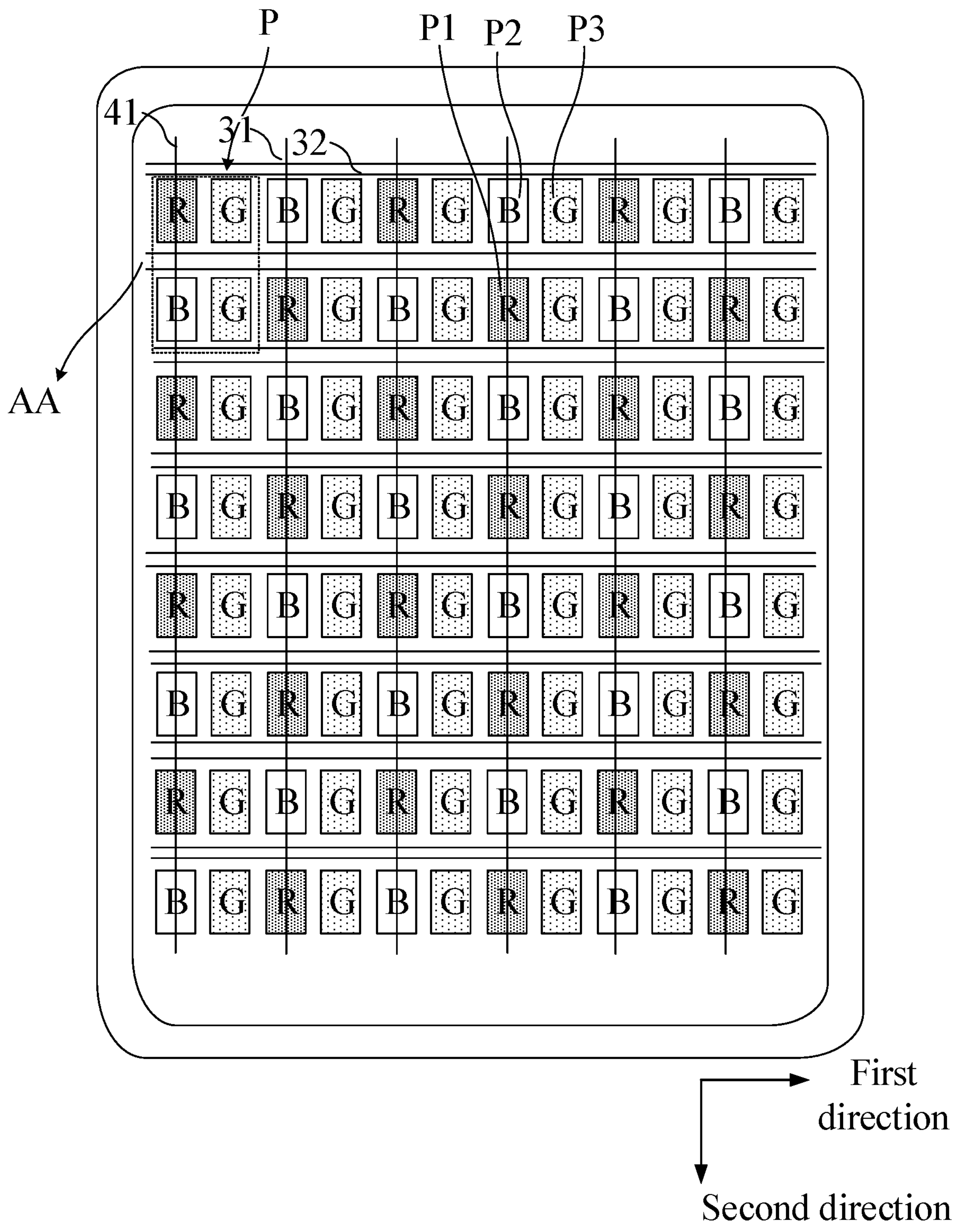
FIG. 1A is a schematic diagram of a planar structure of a display substrate in an embodiment of the present disclosure.

| | | |
|---|---|---|
| 11--First active layer; | 12--Second active layer; | 13--Third active layer; |
| 14--Fourth active layer; | 15--Fifth active layer; | 16--Sixth active layer; |
| 17--Seventh active layer; | | |
| 21--Reset signal line; | 22--First scan signal line; | 221--First protruding portion; |
| 23--Light-emitting control signal line; | 24--First polar plate; | 31--First initialization signal line; |
| 32--Second initialization signal line; | 33--Shielding portion; | 34--First conductive portion; |
| 341--First through hole; | 41--Third initialization signal line; | 42--First power supply line; |
| 43--First connection portion; | 44--Second connection portion; | 45--Third connection portion; |
| 46--Fourth connection portion; | 47--Fifth connection portion; | 411--First extension portion; |
| 412--Second extension portion; | 413--Third extension portion; | 414--Fourth extension portion; |
| 415--Fifth extension portion; | 416--Sixth extension portion; | 421--Seventh extension portion; |
| 51--Data signal line; | 52--Second power supply line; | 53--Flat portion; |
| 531--First color flat portion; | 532--Second color flat portion; | 533--Third color flat portion; |
| 54--Sixth connection portion; | 55--Seventh connection portion; | 56--Eighth connection portion; |
| 61--First electrode; | 61a--Main body part; | 61b--Auxiliary part; |
| 71--First insulating layer; | 72--Second insulating layer; | 73--Third insulating layer; |
| 73--Third insulating layer; | 74--Fourth insulating layer; | 75--Fifth insulating layer; |
| 711--First via hole; | 8--Pixel defining layer; | 81--First opening; |
| 91--Light-emitting layer; | 91--Second electrode; | 001--Base substrate; |
| 102--Driving circuit layer; | 103--Light-emitting structure layer; | 104--Encapsulation layer; |
| 401--First encapsulation layer; | 402--Second encapsulation layer; | 403--Third encapsulation layer. |

DETAILED DESCRIPTION OF THE EMBODIMENTS

In order to make the objective, technical solutions and advantages of the embodiments of the present disclosure clearer, the technical solutions of the embodiments of the present disclosure will be described clearly and completely with reference to accompanying drawings of the embodiments of the present disclosure. The embodiments described below are part of the embodiments of the present disclosure, but not all the embodiments. On the basis of the embodiments described in the present disclosure, all other embodiments obtained by those ordinarily skilled in the art without inventive efforts fall within the protection scope of the present disclosure.

Unless otherwise defined, the technical or scientific terms used here shall have the usual meanings understood by a person of ordinary skill in the art to which the present invention belongs. Ordinal numbers such as "first", "second" and "third" in this specification are disposed to avoid confusion of constituent elements, and are not intended to limit in quantity.

In this specification, for convenience, words and phrases indicating orientation or positional relationship, such as "middle", "upper", "lower", "front", "rear", "vertical", "horizontal", "top", "bottom", "inside" and "outside" are used to describe the positional relationship of constituent elements with reference to the accompanying drawings, are only to facilitate description of this specification and description simplification, rather than indicating or implying that the indicated apparatus or element must have a specific orientation or be constructed and operated in the specific orientation, and therefore cannot be understood as limitation to the present disclosure. The positional relationship of the constituent elements is appropriately changed according to the direction in which each constituent element is described. Therefore, it is not limited to the words and phrases described in the specification, and can be appropriately replaced according to the situation.

In the specification, unless otherwise expressly specified and limited, the terms "installed". "linked" and "connected" should be construed in a broad sense. For example, it may be a fixed connection, or a detachable connection, or an integral connection; it may be a mechanical connection, or an electrical connection; and it may be a direct connection, or an indirect connection through an intermediate piece, or internal communication between two elements. Those skilled in the art may understand the specific meaning of the above terms in the present disclosure according to the specific situation.

In the specification, a transistor refers to an element including at least three terminals of a gate electrode, a drain electrode and a source electrode. The transistor has a channel region between the drain electrode (a drain electrode terminal, a drain region or the drain electrode) and the source electrode (a source electrode terminal, a source region or the source electrode), and current can flow through the drain electrode, the channel region and the source electrode. Note that in the specification, the channel region refers to a region through which the current mainly flows.

In the specification, a first pole may be the drain electrode and a second pole may be the source electrode, or the first pole may be the source electrode and the second pole may be the drain electrode. Functions of the "source electrode" and the "drain electrode" are interchanged sometimes when transistors of opposite polarities are used or when a direction of the current changes during circuit operation. Therefore, in the specification, the "source electrode" and the "drain electrode" may be interchanged, and a "source terminal" and a "drain terminal" may be interchanged.

In the specification. "electrical connection" includes a case where the constituent elements are connected together by an element having a certain electrical effect. The "element having the certain electrical effect" is not particularly limited as long as it can give and receive electrical signals between the connected constituent elements. Examples of the "element having the certain electrical effect" include not only electrodes and wirings, but also switching elements such as the transistor, a resistor, an inductor, a capacitor, other elements having various functions, and the like. The scale of the accompanying drawings in the present disclosure may be used as a reference in the actual process, but is not limited to this, for example: a width-to-length ratio of a channel, thickness and spacing of each film layer, and a width and spacing of each signal line may be adjusted according to actual needs. The number of pixels in a display substrate and the number of sub-pixels in each pixel are not limited to the quantity shown in the figure, and the accompanying drawings described in the present disclosure are only schematic structural diagrams.

In the specification. "parallel" refers to a state where an angle formed by two straight lines is −10° or more and 10° or less, and therefore also includes a state where the angle is −5° or more and 5° or less. In addition. "vertical" refers to a state where the angle formed by the two straight lines is 80° or more and 100° or less, and therefore also includes a state where the angle is 85° or more and 95° or less.

In the specification, a "film" and a "layer" may be interchanged. For example, a "conductive layer" may be replaced with a "conductive film" in some cases. Similarly, an "insulating film" may be replaced with an "insulating layer" in some cases.

In the specification, shapes such as a triangle, a rectangle, a trapezoid, a pentagon or a hexagon refer to corresponding shapes that approximate triangle rectangle, trapezoid, pentagon or hexagon within a range of process and measurement errors. During the actual process, deformation such as a chamfer, an arc edge, a rounded corner, and concave-convex generated within the tolerance range may be included.

"About" in the present disclosure refers to a numerical value within an allowed range of the process and measurement errors without strictly limiting the limit.

FIG. 1A is a schematic diagram of a planar structure of a display substrate in an embodiment of the present disclosure. As shown in FIG. 1A, the display substrate may include a plurality of pixel units P arranged in a matrix. At least one pixel unit P may include a first color sub-pixel P1 emitting light of a first color, a second color sub-pixel P2 emitting light of a second color and two third color sub-pixels P3 emitting light of a third color. Each of the four sub-pixels may include a pixel driving circuit and a light-emitting device. The pixel driving circuit in each sub-pixel is respectively connected with a scanning signal line, a data signal line and a light-emitting control signal line. The pixel driving circuits are configured to receive data voltage transmitted by the data signal lines under control of the scanning signal lines and the light-emitting control signal lines, and output corresponding current to the light-emitting devices. The light-emitting device in each sub-pixel is respectively connected with the pixel driving circuit of the sub-pixel where the light-emitting device is located, and the light-emitting device is configured to emit light of corresponding brightness in response to the current output by the pixel driving circuit of the sub-pixel where the light-emitting device is located.

Figure 1B:
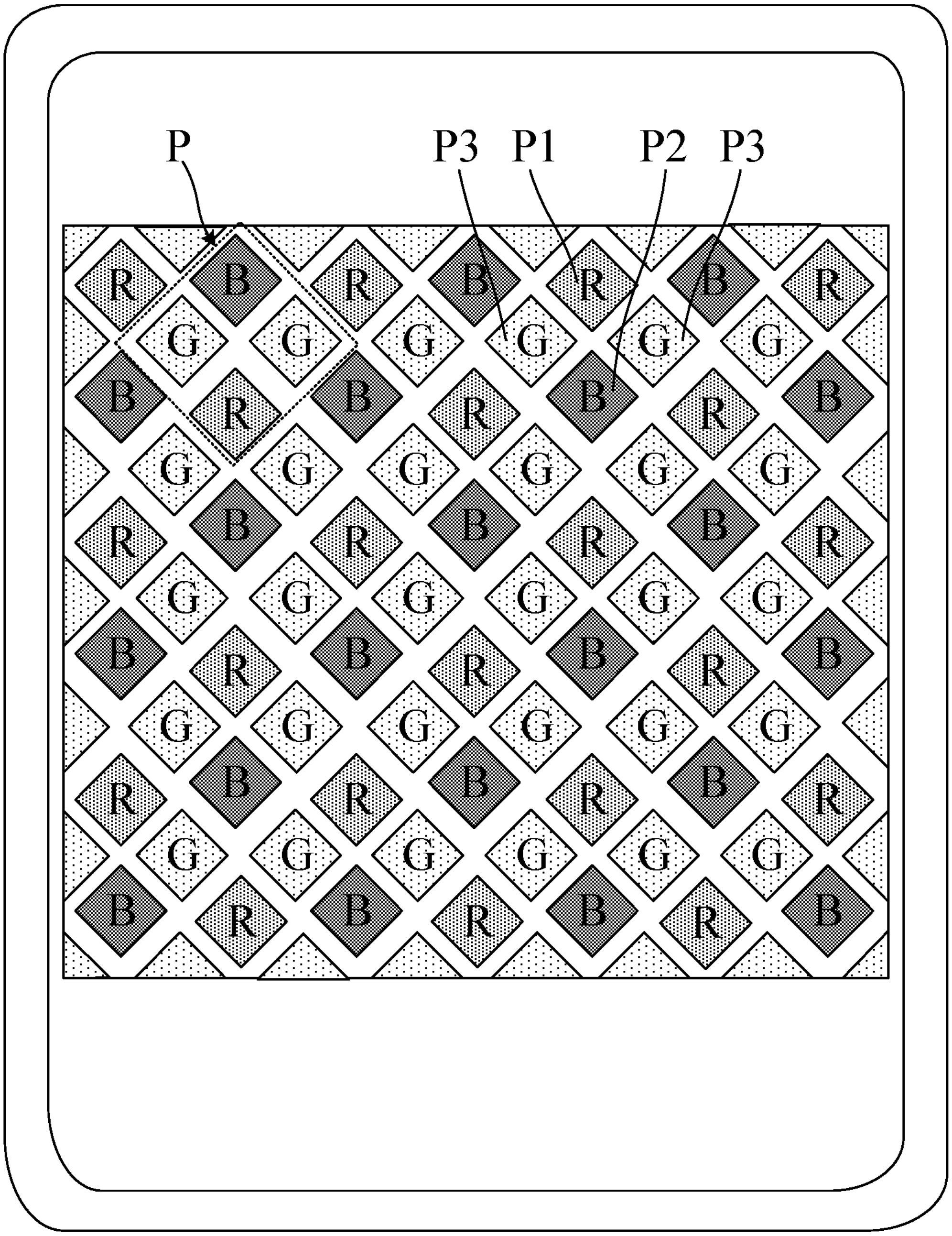
FIG. 1B is a schematic diagram of a planar structure of another display substrate in an embodiment of the present disclosure.

In an exemplary implementation, the first color sub-pixel P1 may be a red sub-pixel (R) emitting red light, and the pixel driving circuit of the first color sub-pixel P1 is electrically connected with a first electrode of a light-emitting device emitting red light. The second color sub-pixel P2 may be a blue sub-pixel (B) emitting blue light, and the pixel driving circuit of the second color sub-pixel P2 is electrically connected with a first electrode of a light-emitting device emitting blue light. The third color sub-pixel P3 may be a green sub-pixel (G) emitting green light, and the pixel driving circuit of the third color sub-pixel P3 is electrically connected with a first electrode of a light-emitting device emitting green light. In an exemplary implementation, a shape of a first electrode of a sub-pixel may be a rectangle, a rhombus, a pentagon or a hexagon. First electrodes of the four sub-pixels may be arranged in a square manner to form GGRB pixels arrangement, as shown in FIG. 1A. First electrodes of the four sub-pixels may be arranged in a diamond manner to form RGBG pixels arrangement, as shown in FIG. 1B. In an exemplary implementation, the four sub-pixels may be arranged in a horizontal parallel manner or a vertical parallel manner. In an exemplary implementation, a pixel unit may include three sub-pixels, and first electrodes of the three sub-pixels may be arranged in horizontal parallel, vertical parallel, delta shape or other manners, which is not limited in the present disclosure.

Figure 2:
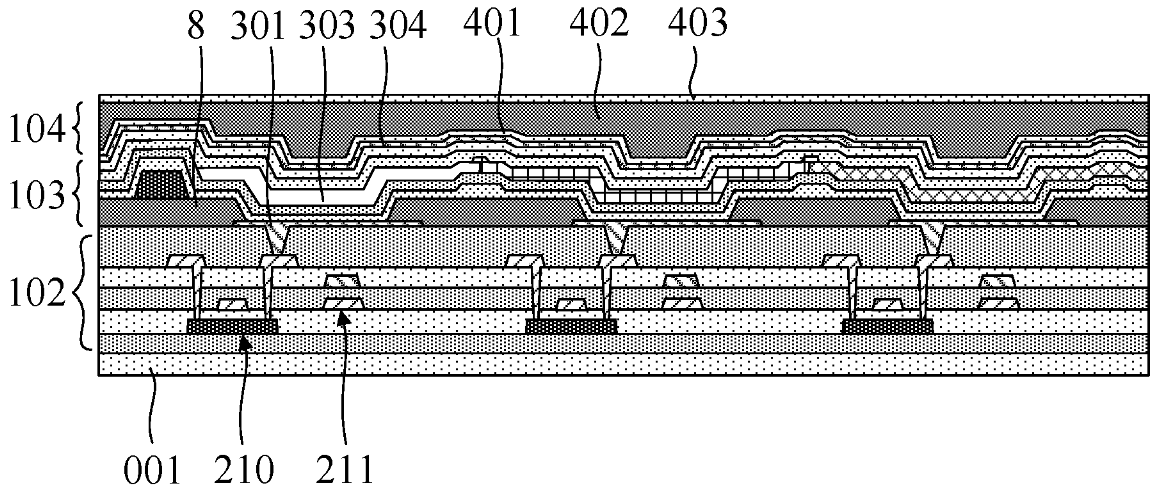
FIG. 2 is a schematic diagram of a sectional structure of a display substrate.

In an exemplary implementation, a driving circuit layer 102 of each sub-pixel may include a plurality of transistors and a plurality of storage capacitors included in a pixel driving circuit. The pixel driving circuit may be a 2T1C, 3T1C, 4T1C, 5T1C, 5T2C, 6T1C, 7T1C or 8T1C structure, where T represents a thin film transistor and C represents a storage capacitor. In FIG. 2, a structure of the pixel driving circuit is simply illustrated by taking only one driving transistor 210 and one storage capacitor 211 as an example.

As shown in FIG. 2, the display substrate has a base substrate 001. The base substrate 001 may be a flexible base substrate or a rigid base substrate. A light-emitting structure layer 103 of each sub-pixel may include a plurality of film layers. The plurality of film layers may include a first electrode 301, a pixel defining layer 8, a light-emitting layer 303 and a second electrode 304. The first electrode 301 is connected with a drain electrode of a driving transistor 210 through a via hole, the organic light-emitting layer 303 is connected with the first electrode 301, the second electrode 304 is connected with the organic light-emitting layer 303, and the organic light-emitting layer 303 is driven by the first electrode 301 and the second electrode 304 to emit light with a corresponding color. An encapsulation layer 104 may include a first encapsulation layer 401, a second encapsulation layer 402 and a third encapsulation layer 403 which are stacked. The first encapsulation layer 401 and the third encapsulation layer 403 may adopt an inorganic material, and the second encapsulation layer 402 may adopt an organic material. The second encapsulation layer 402 is arranged between the first encapsulation layer 401 and the third encapsulation layer 403 to ensure that outside water vapor cannot enter the light-emitting structure layer 103.

In an exemplary implementation, the organic light-emitting layer 303 may include a Hole Injection Layer (HIL), a Hole Transport Layer (HTL), an Electron Block Layer (EBL), an Emitting Layer (EML), a Hole Block Layer (HBL), an Electron Transport Layer (ETL) and an Electron Injection Layer (EIL) which are stacked. In an exemplary implementation, hole injection layers of all the sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, and light-emitting layers and electron block layer of adjacent sub-pixels may overlap slightly, or may be isolated.

Figure 3:
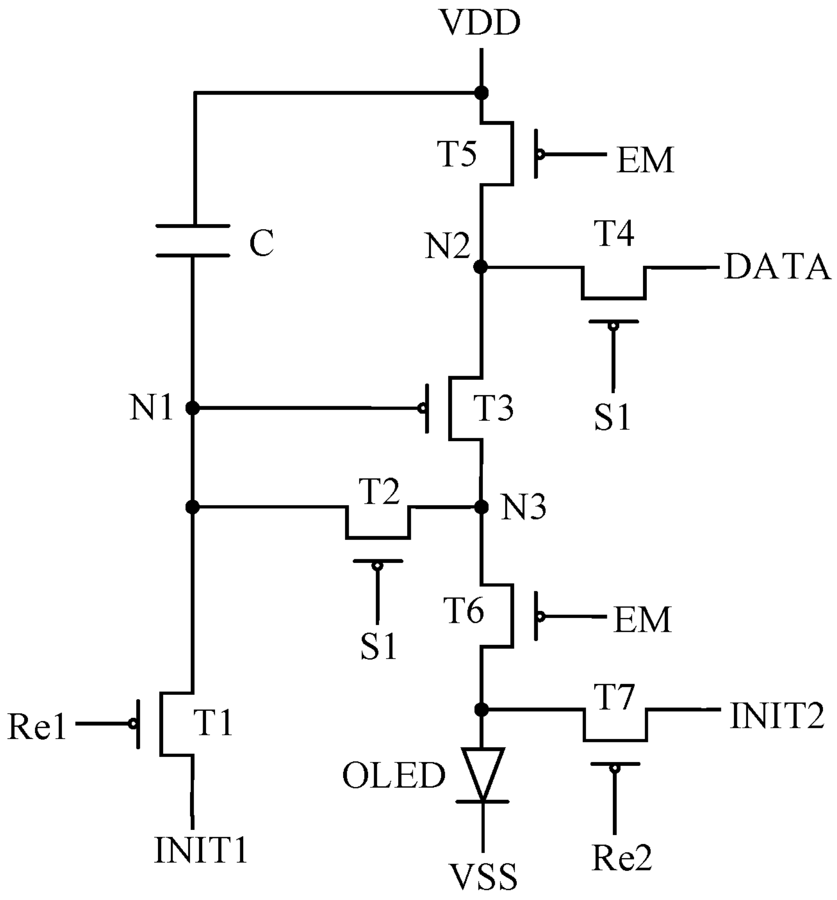
FIG. 3 is a schematic diagram of a circuit structure of a pixel driving circuit in an exemplary embodiment of a display panel of the present disclosure.

In an exemplary implementation. FIG. 3 is a schematic diagram of an equivalent circuit of a pixel driving circuit. As shown in FIG. 3, the pixel driver circuit may include 7 transistors: a first reset transistor T1, a second transistor T2, a driving transistor T3, a fourth transistor T4, a fifth transistor T5, a sixth transistor T6, a second reset transistor T7, and a storage capacitor C. A node connected with a gate of the driving transistor T3 is a first node N1, a node where a first pole of the driving transistor T3 is connected with the fourth transistor T4 is a second node N2, and a node where the second transistor T2 is connected with the driving transistor T3 is a third node N3.

A first pole of the first reset transistor T1 is connected with a first initialization signal terminal INIT1, a control electrode of the first reset transistor T1 is connected with a first reset signal terminal Re1, and a second pole of the first reset transistor T1 is connected with the first node N1. When a conducting level scan signal is applied to the first reset signal terminal Re1, the first reset transistor T1 transmits a first initialization signal to a control electrode of the driving transistor T3 to initialize voltage of the control electrode of the driving transistor T3.

A control electrode of the second transistor T2 is connected with a first scan signal terminal S1, a first pole of the second transistor T2 is connected with the first node N1, and a second pole of the second transistor T2 is connected with a second pole of the driving transistor T3. When a conducting level scan signal is applied to the first scan signal line terminal S1, the second transistor T2 enables the control electrode of the driving transistor T3 be connected with the second electrode.

The control electrode of the driving transistor T3 is connected with the first node N1, that is, the control electrode of the driving transistor T3 is connected with a second polar plate of the storage capacitor C, the first pole of the driving transistor T3 is connected with the second node N2, and the second electrode of the driving transistor T3 is connected with the third node N3. The driving transistor T3 determines a driving current value flowing between a first power supply signal terminal VDD and a second power supply signal terminal VSS according to a potential difference between the control electrode and the first electrode of the driving transistor T3, so as to drive the light-emitting device to emit light.

A first pole of the fourth transistor T4 is connected with a data signal terminal DATA, a second pole of the fourth transistor T4 is connected with the second pole of the driving transistor T3, and a control electrode of the fourth transistor T4 is connected with a first scan signal terminal S1. When a conducting level scan signal is applied to the first scan signal terminal S1, the fourth transistor T4 is configured to input data voltage provided by the data signal terminal DATA to the pixel driving circuit.

A control electrode of the fifth transistor T5 is connected with a light-emitting signal control terminal EM, a first pole of the fifth transistor T5 is connected with the first power supply signal terminal VDD, and a second pole of the fifth transistor T5 is connected with the first pole of the driving transistor T3, that is, the second pole of the fifth transistor T5 is connected with the second node N2. A control electrode of the sixth transistor is connected with the light-emitting signal control terminal EM, a first pole of the sixth transistor is connected with the second pole of the driving transistor T3, a second electrode of the sixth transistor is connected with a first electrode of the light-emitting device, and the first pole of the sixth transistor T6 is connected with the third node N3. When a conducting level light-emitting signal is applied to the light-emitting signal terminal EM, the fifth transistor T5 and the sixth transistor T6 make the light-emitting device emit light by forming a driving current path between the first power supply signal terminal VDD and the second power supply signal terminal VSS.

A control electrode of the second reset transistor T7 is connected with a second reset signal terminal Re2, a first pole of the second reset transistor T7 is connected with a second initialization signal terminal INIT2, and a second pole of the second reset transistor T7 is connected with the first electrode of the light-emitting device. When a conducting level scan signal is applied to the second reset signal terminal Re2, the second reset transistor T7 transmits a second initialization signal to the first electrode of the light-emitting device, so as to initialize the amount of charge accumulated in the first electrode of the light-emitting device or release the amount of the charge accumulated in the first electrode of the light-emitting device.

The storage capacitor C has a first polar plate and a second polar plate, the first polar plate is connected with the first power supply signal terminal VDD, and the second polar plate is connected with the first node N1. That is, the second polar plate of the storage capacitor C is connected with the control electrode of the driving transistor T3.

In an exemplary implementation, the light-emitting device may be an OLED including a first electrode (anode), an organic light-emitting layer and a second electrode (cathode) which are stacked, or may be a QLED including the first electrode (anode), a quantum dot light-emitting layer and the second electrode (cathode) which are stacked.

In an exemplary implementation, a second electrode of the light-emitting device is connected with the second power supply signal terminal VSS, a signal of the second power supply signal terminal VSS is a low level signal, and a signal of the first power supply signal terminal VDD is a continuously-provided high level signal. For the $m^{th}$ display row, the second reset signal terminal Re2 is Re(m), the first reset signal terminal Re1 is Re(m−1), the first reset signal terminal Re1 of the current display row and the second reset signal terminal Re2 in the previously row of pixel driving circuit may be the same signal, which can reduce signal lines of the display panel and realize a narrow bezel of the display panel.

In an exemplary implementation, the seven transistors in the pixel circuit may be P-type transistors, or may be N-type transistors. Using the same type of transistors in the pixel driving circuit can simplify the process flow, reduce the process difficulty of the display panel, and improve the product yield. In some possible implementations, the first transistor T1 to the seventh transistor T7 may include the P-type transistors and the N-type transistors.

In an exemplary implementation, a transistor in a pixel circuit may employ a low temperature poly-silicon thin film transistor, or an oxide thin film transistor, or both the low temperature poly-silicon thin film transistor and the oxide thin film transistor. An active layer of the low temperature poly-silicon thin film transistor employs Low Temperature Poly-Silicon (LTPS), and an active layer of the oxide thin film transistor employs an oxide semiconductor (Oxide). The low temperature poly-silicon thin film transistor has the advantages of high mobility and fast charging, and the oxide thin film transistor has the advantages of low leakage current. The low temperature poly-silicon thin film transistor and the oxide thin film transistor are integrated on one display substrate to form a display substrate containing both the low temperature poly-silicon thin film transistor and the oxide transistor (Low Temperature Poly-Silicon+Oxide, LTPO), thus low frequency driving may be realized by utilizing the advantages of the low temperature poly-silicon thin film transistor and the oxide transistor, power consumption can be reduced, and the display quality can be improved.

Figure 4:
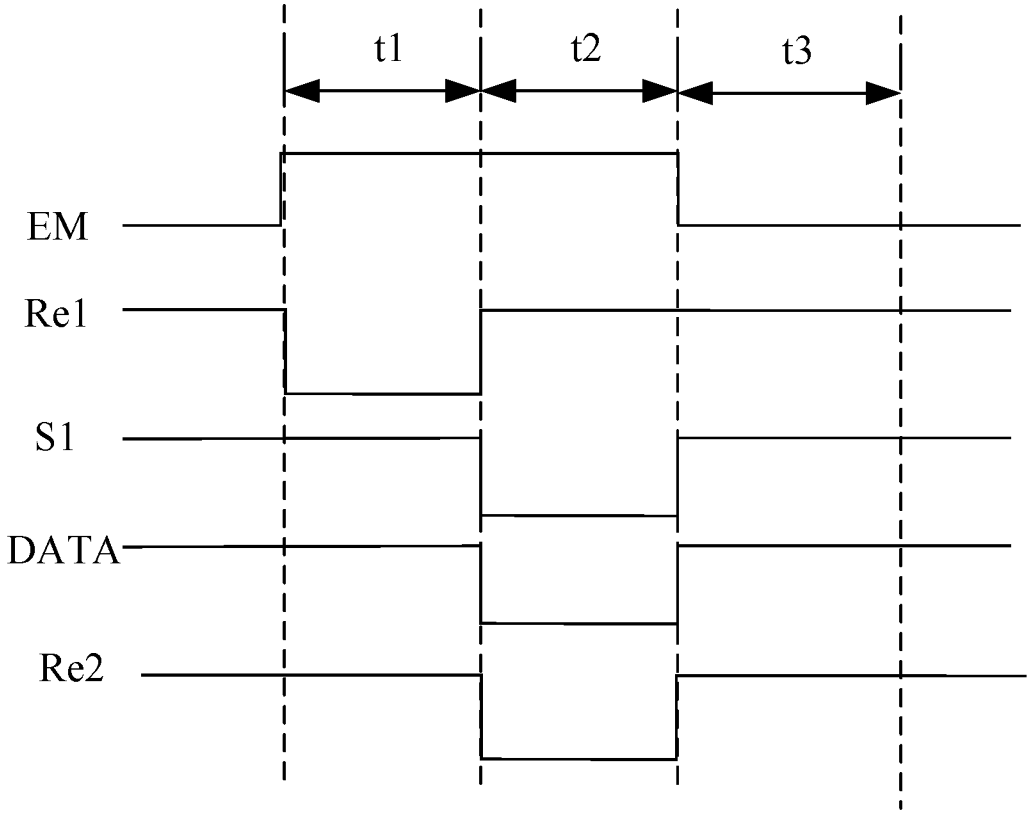
FIG. 4 is a possible timing diagram of a method for driving the pixel driving circuit of FIG. 3.

FIG. 4 is a working timing diagram of a method for driving the pixel driving circuit in FIG. 3. Exemplary embodiments of the present disclosure will be described below through an operation process of the pixel driving circuit exemplified in FIG. 4. Re1 represents a timing sequence of the first reset signal terminal. Re2 represents a timing sequence of the second reset signal terminal. S1 represents a timing sequence of the first scan signal terminal. EM represents a timing sequence of the light-emitting control signal terminal. DATA represents a timing sequence of the data signal terminal, and all the seven transistors are the P-type transistors.

In an exemplary implementation, taking an OLED as an example, the process of the pixel driving circuit may include the following stages.

A first stage t1 is called a reset stage. The first reset signal terminal Re1 outputs a low level signal to conduct the first reset transistor T1, and the first initialization signal terminal INIT1 inputs an initial signal to the first node N1, initializes the storage capacitor C. and clears original data voltage in the storage capacitor. The second reset signal terminal Re2, the first scan signal terminal S1 and the light-emitting signal control terminal EM output a high level signal, so that the second transistor T2, the fourth transistor T4, the fifth transistor T5, the sixth transistor T6 and the second reset transistor T7 are disconnected, and the OLED does not emit light at this stage.

The second stage t2 is called a data writing stage or a threshold compensation stage. The first scan signal terminal S1 outputs a low level signal, the fourth transistor T4, the second transistor T2, and the second reset transistor T7 are conducted, and at the same time, the data signal terminal DATA outputs a driving signal to write data voltage to the first node N1. At this time, the second transistor T2 is turned on, so that the driving transistor T3 is in a diode-connected state, and the data voltage is provided to the second node N2 through the first node N1, the conducted third transistor T3, the third node N3, and the conducted second transistor T2, and a difference between a data voltage output by the data signal terminal DATA and a threshold voltage of the driving transistor T3 is charged into the storage capacitor C, the voltage of the second polar plate (the second node N2) of the storage capacitor C is Vdata-|Vth|. Vdata is the data voltage output by the data signal line DATA, and Vth is the threshold voltage of the driving transistor T3.

The second reset transistor T7 is conducted, so that second initialization voltage of the second initialization signal terminal INIT2 is provided to the first electrode of the OLED, to initialize (reset) the first electrode of the OLED, clear the internal pre-stored voltage, and complete initialization, thereby ensuring that the OLED does not emit the light. The first reset signal line Re1 outputs a high level signal, so that the first transistor T1 is disconnected. The light-emitting control signal terminal EM outputs a high level signal, so that the fifth transistor T5 and the sixth transistor T6 are disconnected.

The third stage 13 is called a light-emitting stage. The light-emitting control signal terminal EM outputs a low level signal, and the first reset signal terminal Re1, the second reset signal terminal Re2 and the first scan signal terminal S1 output a high level signal. A signal of the light-emitting control signal terminal EM is the low level signal, so that the fifth transistor T5 and the sixth transistor T6 are conducted, and a first power supply voltage output by the first power supply signal terminal VDD provides a driving voltage to the first electrode of the OLED through the conducted fifth transistor T5, the driving transistor T3 and the sixth transistor T6 to drive the OLED to emit the light.

In the driving process of the pixel driving circuit, the driving current flowing through the driving transistor T3 is determined by a voltage difference between the control electrode and the first electrode of the driving transistor T3. Since a voltage of the second node N2 is Vdata−|Vth|, a driving current of the third transistor T3 is:

$$I=K^*(Vgs-Vth)^2=K^*[(Vdd-\mathrm{Vdata}+|Vth|)]2=K^*[(Vdd-\mathrm{Vdata})]^2.$$

I represents a driving current flowing through the driving transistor T3, that is, a driving current for driving the OLED. K represents a constant. Vgs represents a voltage difference between the control electrode and the first pole of the driving transistor T3. Vth represents a threshold value voltage of the driving transistor T3. Vdata is a data voltage output by the data signal terminal DATA, and Vdd is a first power supply voltage output by the first power supply signal terminal VDD. The pixel driving circuit can avoid the influence of a threshold value of the driving transistor on its output current.

The pixel driving circuit may respectively provide a first initialization signal to the first node N1 through the first initialization signal terminal INIT1, and provide a second initialization signal to the first electrode of the light-emitting device through the second initialization signal terminal INIT2.

Specifically, in an exemplary implementation, the present disclosure provides a display substrate, including: a base substrate; and a plurality of sub-pixels arranged in an array, wherein at least one sub-pixel includes a pixel driving circuit and a light-emitting device, the plurality of sub-pixels form an array of M rows*N columns, and M and N are positive integers greater than or equal to 1: the pixel driving circuit includes a plurality of transistors, and the plurality of transistors include driving transistors; and the light-emitting device includes a first electrode.

The base substrate further includes: a first initialization signal line and a second initialization signal line; and the first initialization signal line and the second initialization signal line extend in a first direction, and the first direction is an extension direction of sub-pixel rows.

The first initialization signal line is respectively electrically connected with the $m^{th}$ row of sub-pixels, and is configured to transmit a first initialization signal to a control electrode of a driving transistor of the $m^{th}$ row of sub-pixels; and the second initialization signal line is respectively electrically connected with the $(m-1)^{th}$ row of sub-pixels, and is configured to transmit a second initialization signal to a first electrode of a light-emitting device of the $(m-1)^{th}$ row of sub-pixels.

In a second direction, a projection of the first initialization signal line on the base substrate is located on one side of a projection of the second initialization signal line on the base substrate close to a projection of the $(m-1)^{th}$ row of sub-pixels on the base substrate, the second direction is an extension direction of sub-pixel columns, and m is a positive integer greater than or equal to 1 and less than or equal to M.

The first initialization signal is different from the second initialization signal.

Figure 5:
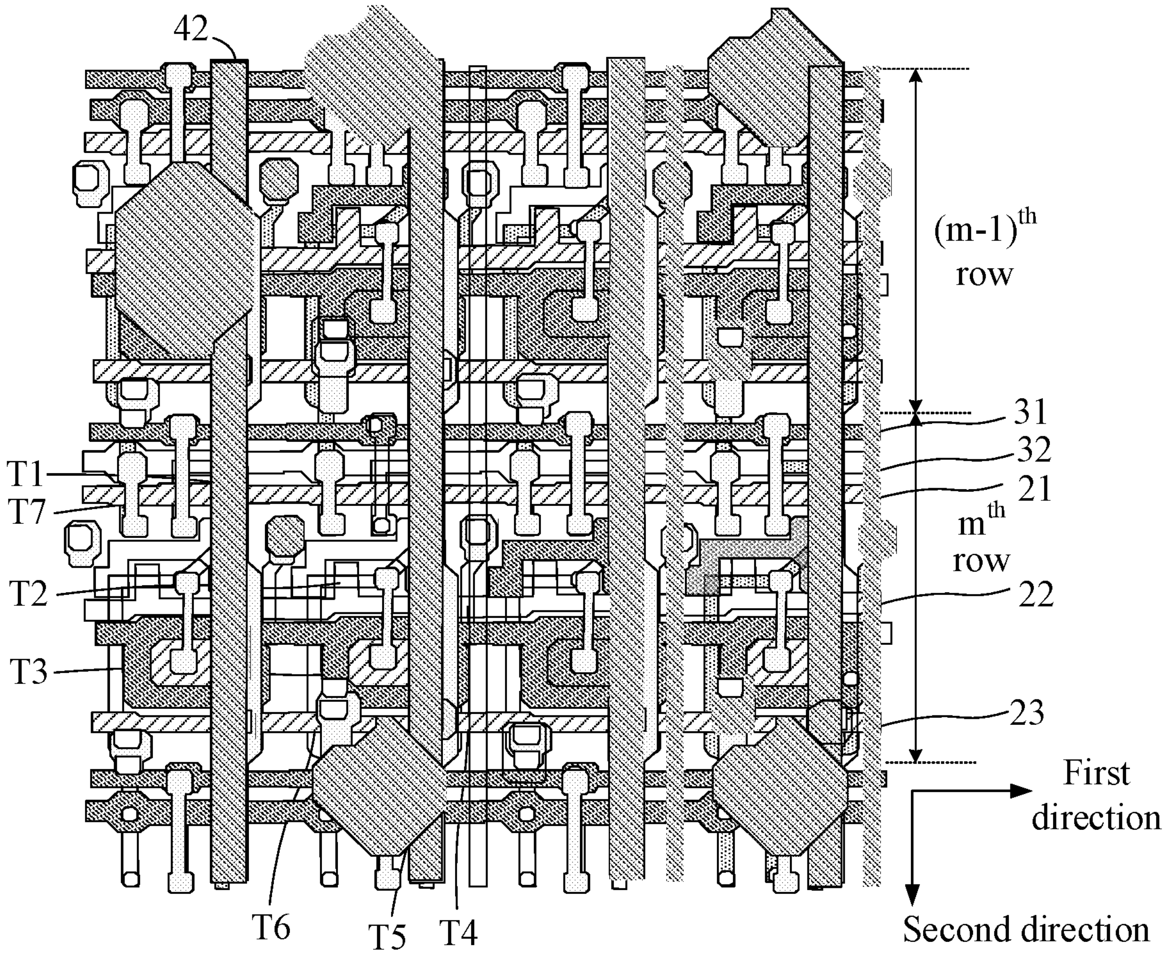
FIG. 5 is a schematic diagram of a structure of an exemplary embodiment of a display substrate of the present disclosure.

Specifically, as shown in FIG. 5, the display substrate includes a base substrate. FIG. 5 shows a specific structural diagram of the display substrate in the implementation. In a plane parallel to the display substrate, the display substrate may include a plurality of sub-pixels arranged in an array, at least one of the plurality of sub-pixels arranged in the array includes a pixel driving circuit. A plurality of pixel driving circuits form M pixel rows in a first direction, the plurality of pixel driving circuits are arranged in a second direction to form N pixel columns, where M and N are both positive integers greater than or equal to 1. The first direction and the second direction intersect, and further, the first direction and the second direction may be perpendicular.

As shown in FIG. 5, the pixel driving circuit may include a plurality of transistors and a light-emitting device, and the pixel driving circuit may adjust a driving current flowing through the driving transistors to drive the light-emitting device to emit light.

Continuing to refer to FIG. 5, the display substrate further includes a first initialization signal line 31 and a second initialization signal line 32. The first initialization signal line 31 and the second initialization signal line 32 are both signal lines of a main body part extending in the first direction. In the present disclosure. A extending in the B direction means that A may include a main part and a secondary part connected with the main part, the main part is a line, a line segment or a bar-shaped body, the main part stretches in the B direction, and a length of the main part stretching in the B direction is greater than a length of the secondary part stretching in other directions. The first initialization signal line 31 may provide the first initialization signal Vinit1 to the first initialization signal terminal INIT in the pixel driving circuit, and the second initialization signal line 32 may provide the second initialization signal Vinit2 to the second initialization signal terminal INIT2 in the pixel driving circuit.

Continuing to refer to FIG. 5, taking the $m^{th}$ pixel row as an example, the first initialization signal line 31 is respectively electrically connected with the $m^{th}$ row of sub-pixels, and the first initialization signal line 31 is configured to transmit the first initialization signal Vinit1 transmitted on the first initialization signal line 31 to a control electrode of the $m^{th}$ row of pixel driving transistor (i.e., a gate electrode of the driving transistor) to reset the control electrode. The second initialization signal line 32 is respectively electrically connected with the $(m-1)^{th}$ row of sub-pixels, and the second initialization signal line 32 is configured to transmit the second initialization signal Vinit2 transmitted on the second initialization signal line 32 to the first electrode of the light-emitting device of the $(m-1)^{th}$ row of sub-pixels (for example, the first electrode may be an anode), to reset the anode of the light-emitting device. In the second direction, a projection of the first initialization signal Vinit1 on the base substrate is located on one side of a projection of the second initialization signal line Vinit2 on the base substrate away from the $(m-1)^{th}$ row of sub-pixels. Wherein, m is a positive integer greater than or equal to 1 and less than or equal to M.

The first initialization signal Vinit1 and the second initialization signal Vinit2 may not be equal. Therefore, the pixel driving circuit may provide different initialization signals to the first node N1 and the first electrode of the light-emitting device according to actual requirements. For example, an effective level voltage of the first initialization signal may be set to be −3V. and an effective level voltage of the second initialization signal may be set to be −4V, which can ensure that a display screen has low brightness in a black state and improve a picture display effect. In another possible implementation, the first initialization signal line 31 and the second initialization signal line 32 are located between driving transistors of two adjacent rows of sub-pixels, and located on the same side of any row of driving transistors in the second direction. As shown in FIG. 5, in a column direction, the first initialization signal line 31 and the second initialization signal line 32 are located between driving transistors of the $m^{th}$ row of sub-pixels and driving transistors of the $(m-1)^{th}$ row of sub-pixels, located on the same side of the $m^{th}$ row of driving transistors, and also located on the same side of the $(m-1)^{th}$ row of driving transistors. The first initialization signal line 31 and the second initialization signal line 32 are disposed between two adjacent rows of sub-pixels, so that the two signal lines may have a relatively shorter reset path when resetting the first node N1 of the $m^{th}$ row of sub-pixels and the first electrode of the light-emitting device of the $(m-1)^{th}$ row of sub-pixels, and thus reset can be performed more quickly and sufficiently. At the same time, such disposing manner also helps to make better use of the space of the display substrate, makes the pixels arrange more reasonably and take up less space, and makes it easier to realize high-resolution display.

In another possible implementation, a width of the first initialization signal line 31 in the second direction is different from a width of the second initialization signal line 32 in the second direction. It should be noted that the "width in the second direction" refers to a width of a main part of the first initialization signal line 31 or the second initialization signal line 32 extending in the first direction in the second direction. The second direction is an extension direction of the pixel column. A square resistance value of a signal line has a negative correlation with a width of the signal line, that is, the larger the width of the signal line is, the smaller the square resistance value is. Setting a width of one of the two signal lines to be wider can effectively reduce the overall square resistance of the two signal lines. At the same time, setting the width of one of the two signal lines to be wider also helps to reduce the resistance while making full use of the space of the display substrate to improve the display effect. Specifically, in one possible implementation, the width of the second initialization signal line 32 in the second direction may be greater than the width of the first initialization signal line 31 in the second direction. Further, in one possible implementation, the width of the second initialization signal line 32 is 1.3-2.4 times the width of the first initialization signal line 31.

In another possible implementation, continuing to refer to FIG. 5, the display substrate further includes: a reset signal line 21 extending in the first direction, and the plurality of transistors include a first reset transistor T1 and a second reset transistor T7. Taking the $m^{th}$ row of sub-pixels as an example: the reset signal line 21 is configured to provide a first reset signal to a first reset signal terminal Re1 of the driving circuit of the $m^{th}$ row of sub-pixels, meanwhile, the reset signal line 21 is configured to provide a second reset signal to a second reset signal terminal Re2 of the driving circuit of the $(m-1)^{th}$ row of sub-pixels. At this time, the $m^{th}$ row of first reset signal Re1 and the $(m-1)^{th}$ row of second reset signal Re2 are the same signal. Specifically, taking a P-type transistor as an example, when the first reset signal Re1 is a low level signal, the first reset transistor T1 of the $m^{th}$ row of pixel circuit is conducted, and the first initialization signal Vinit1 may be written into the control electrode of the driving transistor T3 of the $m^{th}$ row of sub-pixels via the first reset transistor T1. The second reset transistor T7 is conducted when the second reset signal is a low level, and the second initialization signal Vinit2 may be written into the first electrode of $(m-1)^{th}$ row of sub-pixels via the second reset transistor T7.

In an exemplary implementation, continuing to refer to FIG. 5, in the second direction, the reset signal line 21, the second initialization signal line 32, and the first initialization signal line 31 are arranged in sequence in a direction away from the driving transistor of the $m^{th}$ row of sub-pixels.

In an exemplary implementation, as shown in FIG. 6 to FIG. 10, in a plane perpendicular to the display substrate, the display substrate may include a semiconductor layer 1, a first conductive layer 2, a second conductive layer 3, a third conductive layer 4 and a fourth conductive layer 5 disposed on the base substrate in sequence. The semiconductor layer 1 includes active layers of the plurality of transistors, the active layer includes channel regions and source-drain regions of the transistors; the first conductive layer 2 includes the reset signal line 21 and control electrodes of the transistors, the second conductive layer 3 includes the first initialization signal line 31 and the second initialization signal line 32; the third conductive layer 4 includes a first power supply line 42, and a first pole and a second pole of the transistor, and the fourth conductive layer 5 includes a second power supply line 52 and a data signal line 51.

Figure 7:
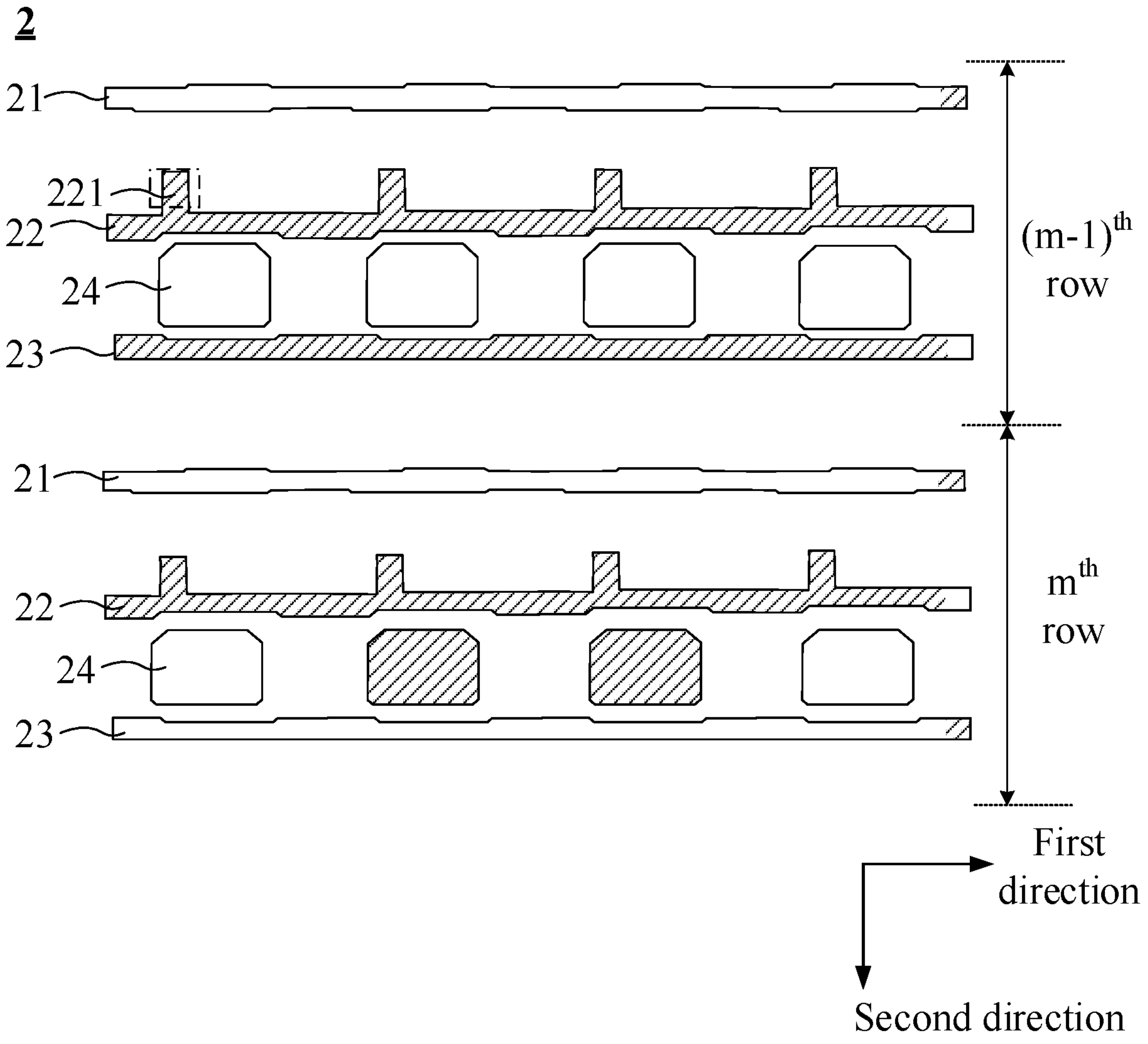
FIG. 7 is a schematic structural diagram of a first conductive layer of the display substrate in FIG. 5.
Figure 8:
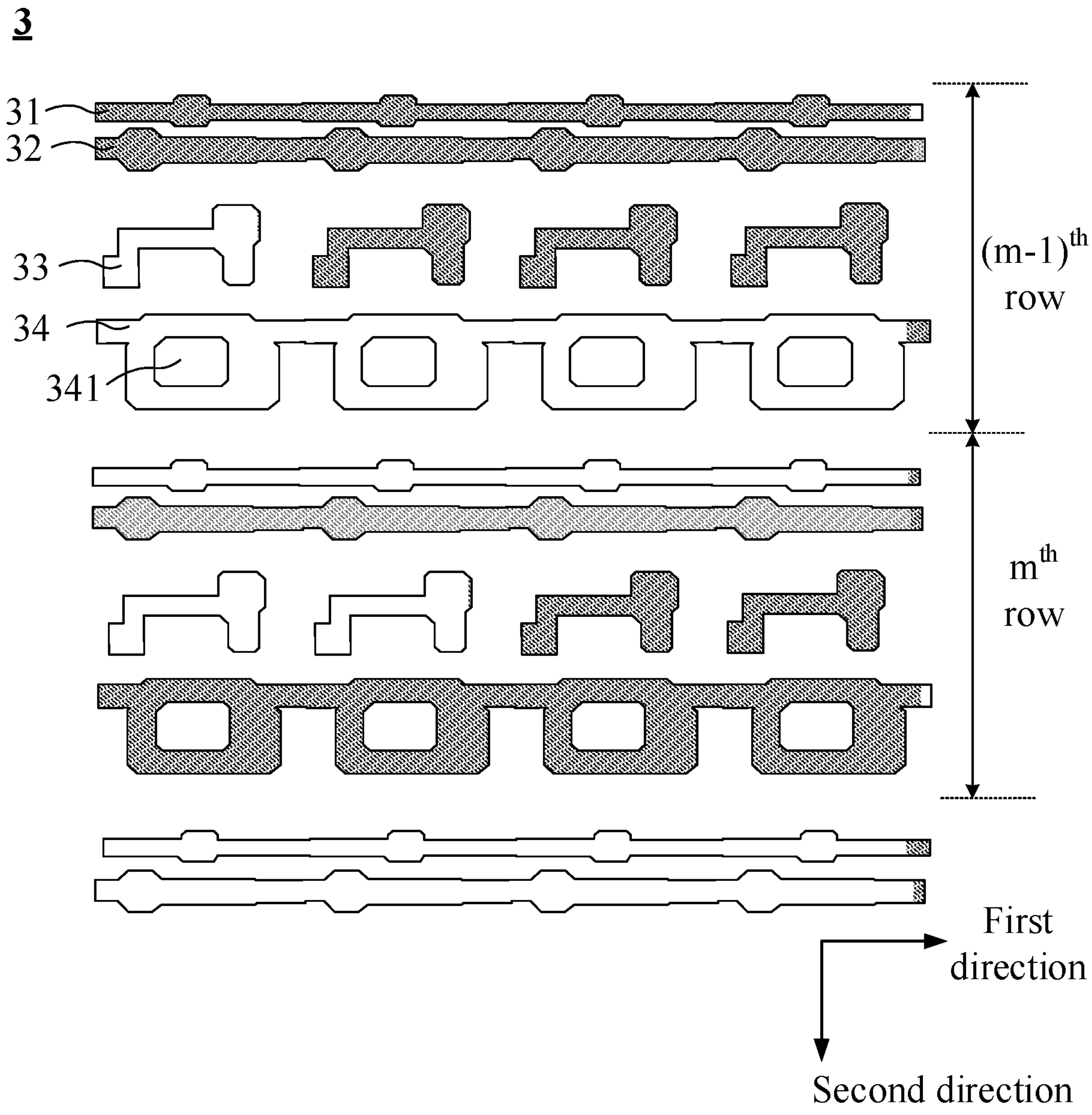
FIG. 8 is a schematic structural diagram of a second conductive layer of the display substrate in FIG. 5.
Figure 9:
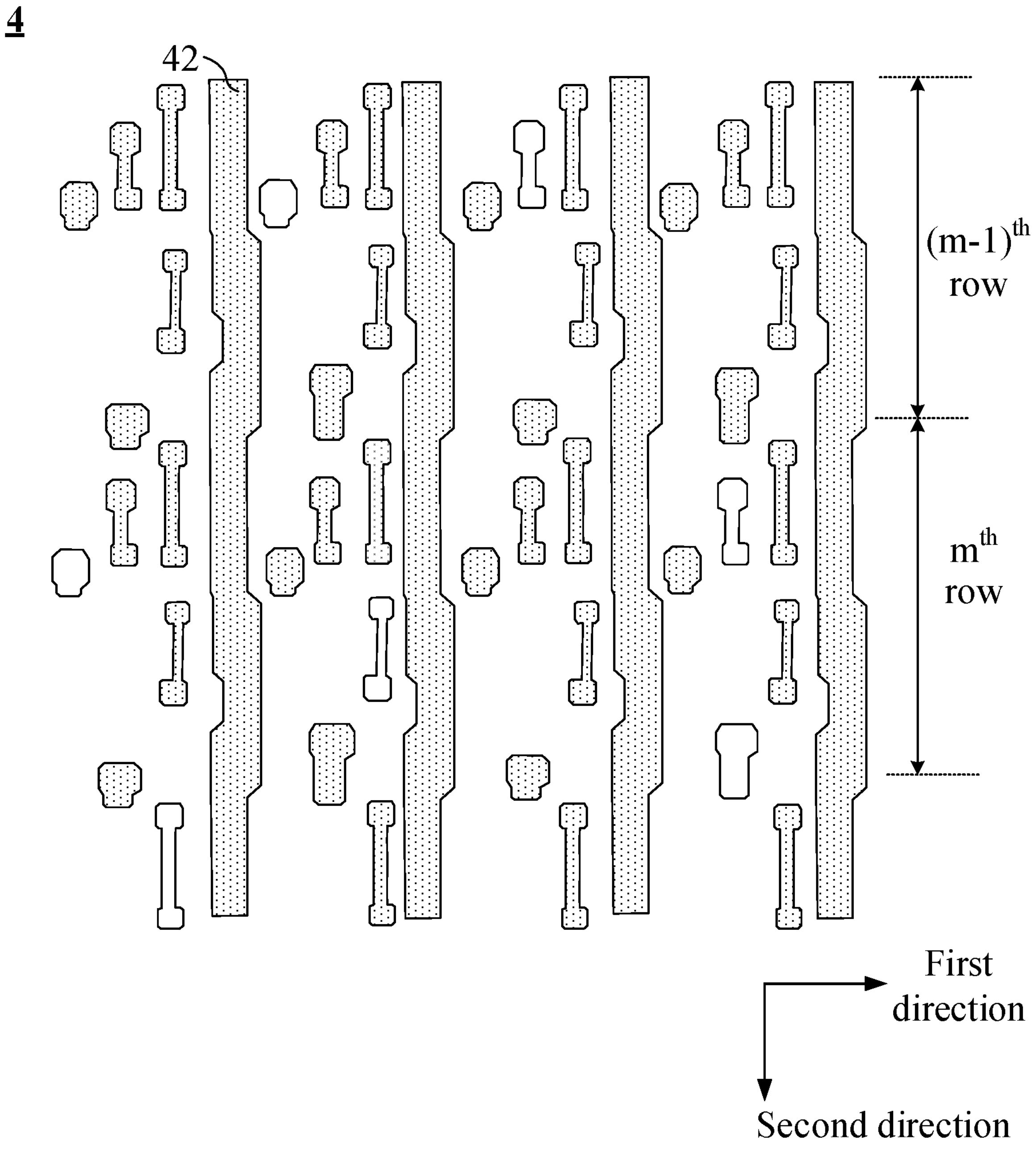
FIG. 9 is a schematic structural diagram of a third conductive layer of the display substrate in FIG. 5.
Figure 10:
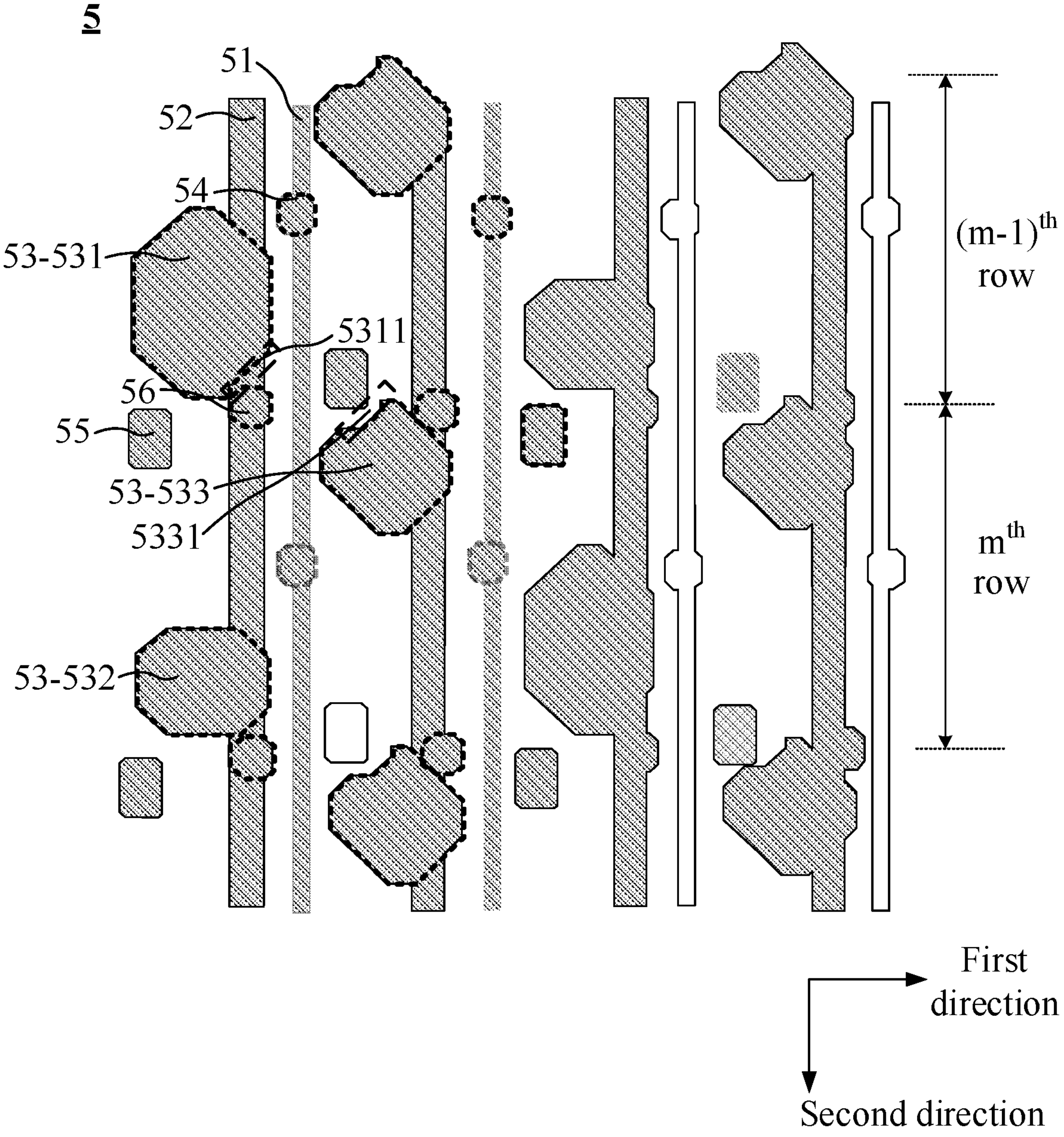
FIG. 10 is a schematic structural diagram of a fourth conductive layer of the display substrate in FIG. 5.
Figure 11:
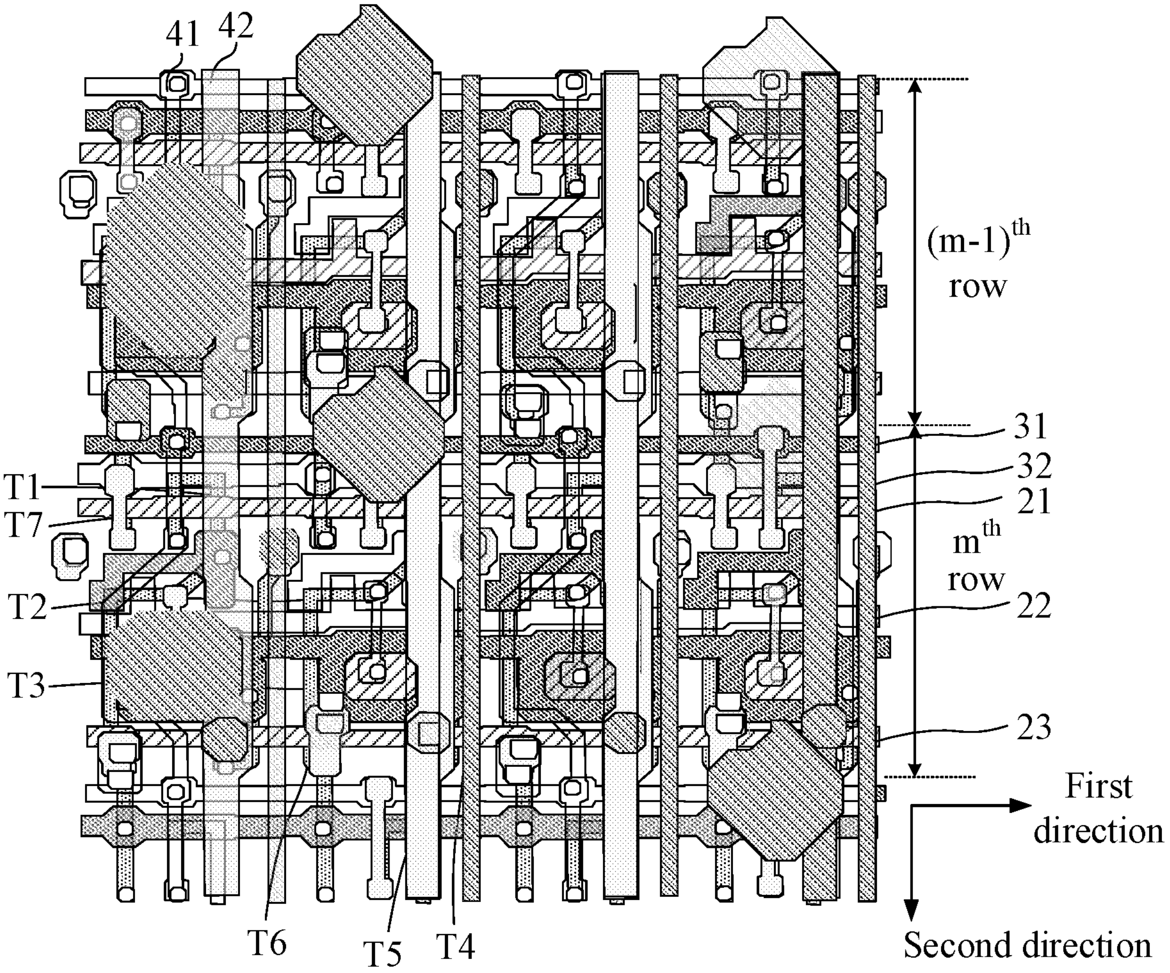
FIG. 11 is a schematic diagram of a structure of an exemplary embodiment of a display substrate of the present disclosure.

In another possible implementation, referring to FIG. 11, the display substrate further includes a third initialization signal line 41 extending in the second direction, which is disposed in a different layer from the first initialization signal line 31. The semiconductor layer in the embodiment shown in FIG. 11, a first metal layer, a second metal layer, a fourth metal layer and the like may all be arranged with reference to FIG. 6A. FIG. 7. FIG. 8 and FIG. 10, which is not repeated herein. In the present disclosure. "A and B are arranged in the same layer" means that A and B are simultaneously formed through the same patterning process, and a "thickness" of the film layer is a dimension of the film layer in the direction perpendicular to the display substrate. The third initialization signal line 41 is electrically connected with one of the first initialization signal line 31 and the second initialization signal line 32. Specifically, referring to FIG. 12A and FIG. 12B, the third initialization signal line 41 may be located in the third conductive layer 4. In another possible implementation, referring to FIG. 11, the third initialization signal line 41 may be electrically connected with the first initialization signal line 31.

Arranging the third initialization signal line 41 in the layer different from the first initialization signal line 31 and the second initialization signal line 32 and electrically connecting the third initialization signal line 41 to one of the first initialization signal line 31 and the second initialization signal line 32, can make the initialization signal Vinit1 or Vinit2 transmitted in different directions in the different layers, which is helpful to reduce voltage drop of initialization signal transmission and improve the uniformity of a displayed picture. Specifically, the third initialization signal line 41 may be connected with the first initialization signal line 31 through a via hole.

Figure 13:
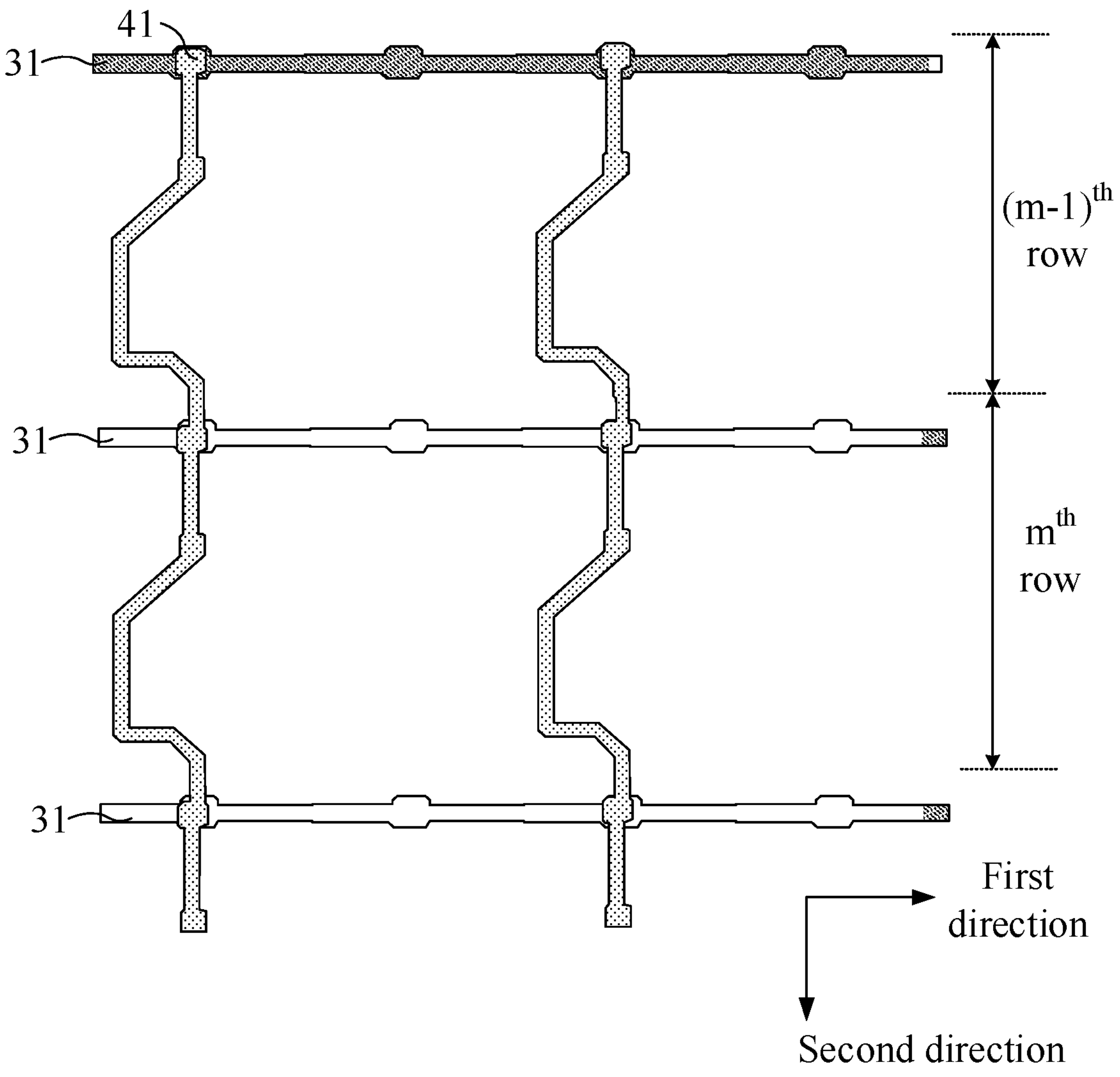
FIG. 13 is a schematic diagram of connection between a first initialization signal line and a third initialization signal line in the display substrate in FIG. 11.

Further, in another possible implementation, the third initialization signal line 41 and the first initialization signal line 31 are connected through the via hole to form a mesh distribution structure, as shown in FIG. 13. The use of the mesh distribution structure can significantly reduce the voltage drop of transmission of the first initialization signal Vinit1, and can significantly improve the uniformity of the picture.

In another possible implementation, continuing to refer to FIG. 11, at least one column of sub-pixels is arranged between the two adjacent third initialization signal lines 41. That is, for the sub-pixels with M rows and N columns in total, the third initialization signal lines 41 are only arranged in odd-numbered columns, such as the first column, the third column, the fifth column, . . . , and so on. Of course, the third initialization signal lines 41 may also be arranged only in even-numbered columns, such as the second column, the fourth column, the sixth column, . . . , and so on. Disposing the third initialization signal lines 41 at intervals can help to increase the distance between the two adjacent signal lines, reduce parasitic capacitance, and improve the quality of the displayed picture.

In another possible implementation, continuing to refer to FIG. 11, at least two first power supply lines 42 are arranged between the two adjacent third initialization signal lines 41. For example, two first power supply lines 42 with a constant voltage may be arranged between the two adjacent third initialization signal lines 41, and the first power supply lines 42 provide a first power supply voltage Vdd for a first power supply signal terminal VDD of the pixel driving circuit. Such disposing manner is beneficial to maximize the utilization of the space of the base substrate, realize close arrangement of the pixels, and meanwhile be capable of preventing crosstalk between the adjacent third initialization signal lines 41 and improving the quality of the displayed picture.

In one possible implementation, shapes of the two adjacent third initialization signal lines may be the same or different. "A and B have the same shape" mentioned in the present disclosure means that the shapes of A and B are approximately the same within a reasonable error range or process variation.

In one possible implementation, the plurality of transistors include a first reset transistor T1, a second transistor T2, a driving transistor T3, a fourth transistor T4, a fifth transistor T5, a sixth transistor T6, and a second reset transistor T7.

Figure 6A:
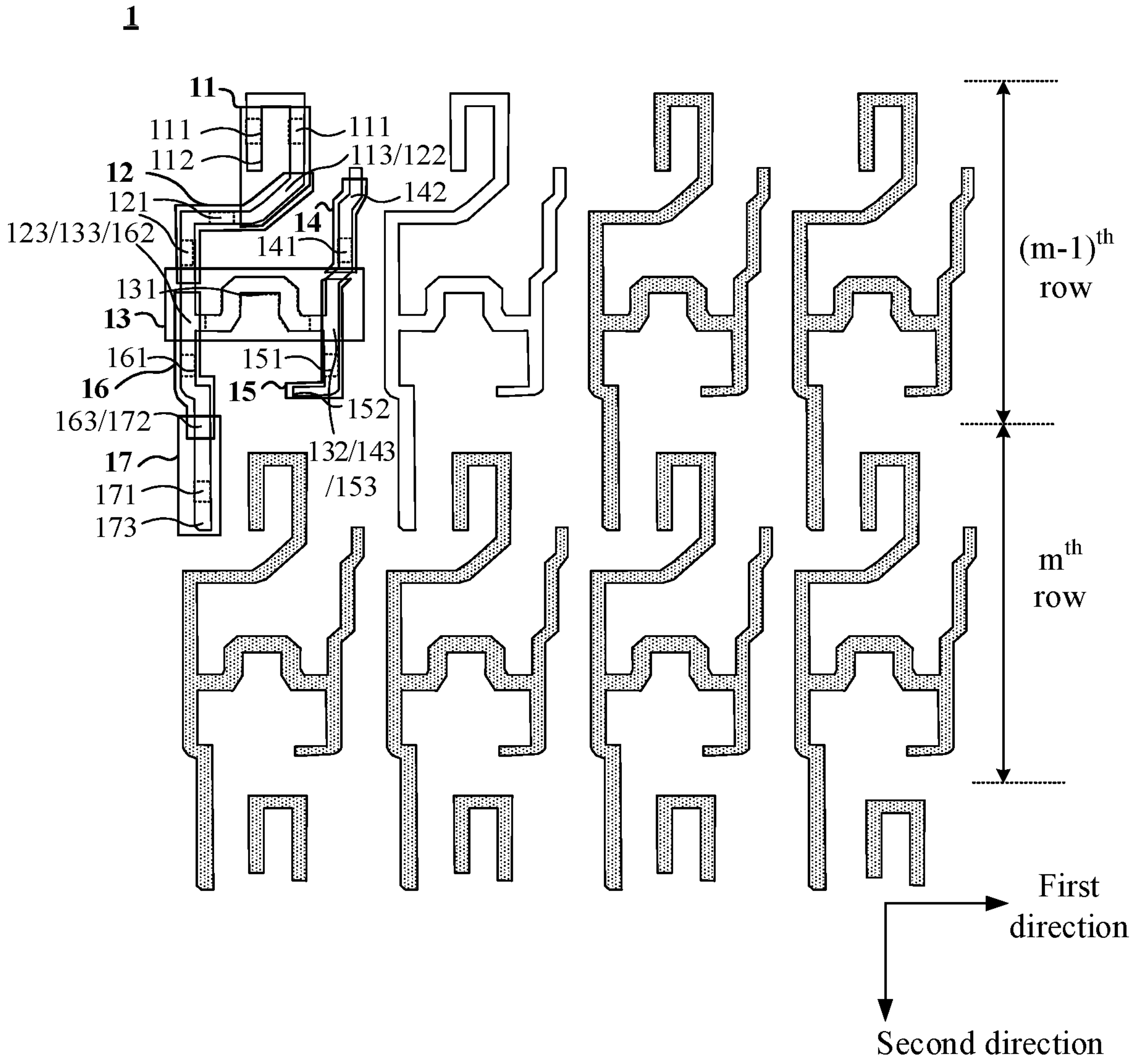
FIG. 6A is a schematic structural diagram of a semiconductor layer of the display substrate in FIG. 5.
Figure 6B:
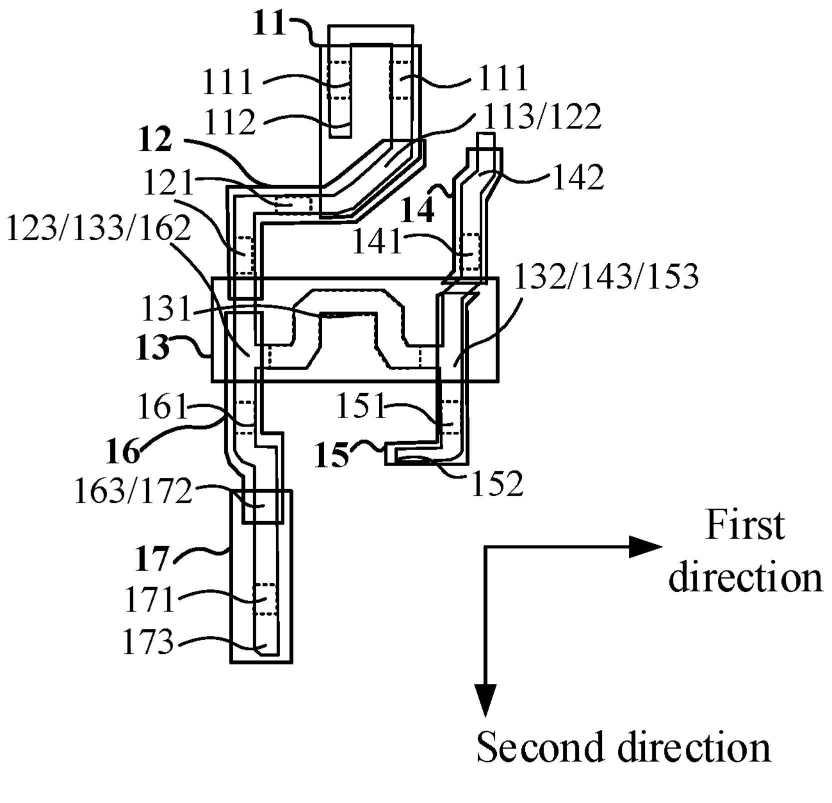
FIG. 6B is an enlarged view of a schematic structural diagram of a semiconductor layer in one sub-pixel region in FIG. 5.

As shown in FIG. 6A and FIG. 6B, the semiconductor layer 1 includes: a first active layer 11 of the first transistor T1 to a seventh active layer 17 of the second reset transistor. The active layer of each transistor includes a source-drain region and a channel region, the source-drain region of each transistor includes a first region and a second region, and the channel region of each transistor is located between the first region and the second region of the transistor. Specifically, as shown in FIG. 6B, the first active layer 11 includes a channel region 111, a first region 112 and a second region 113 of the first transistor T1; the first active layer 12 includes a channel region 121, a first region 122 and a second region 123 of the second transistor T2; the third active layer 13 includes a channel region 131, a first region 132 and a second region 133 of the driving transistor T3; the fourth active layer 14 includes a channel region 141, a first region 142 and a second region 143 of the fourth transistor T4; the fifth active layer 15 includes a channel region 151, a first region 152 and a second region 153 of the fifth transistor T5; the sixth active layer 16 includes a channel region 161, a first region 162 and a second region 163 of the sixth transistor T6; and the seventh active layer 17 includes a channel region 171, a first region 172 and a second region 173 of the seventh transistor T7. The first region 112 of the first active layer 11 is disposed separately, the second region 113 of the first active layer 11 simultaneously serves as the first region 122 of the second active layer 12, the first region 132 of the third active layer 13 simultaneously serves as the second region 143 of the fourth active layer 14 and the second region 153 of the fifth active layer 15, the second region 133 of the third active layer 13 simultaneously serves as the second region 123 of the second active layer 12 and the first region 162 of the sixth active layer 16, and the second region 163 of the sixth active layer 16 simultaneously serves as the first region 172 of the seventh active layer 17. In an exemplary embodiment, the first region 142 of the fourth active layer 14, the first region 152 of the fifth active layer 15, and the second region 173 of the seventh active layer are disposed separately.

The first active layer 11, the second active layer 12, and the fourth active layer 14 in the $(m-1)^{th}$ pixel row are located on one side of the third active layer 13 of the current pixel driving circuit away from the $m^{th}$ pixel row, the first active layer 11 is located on one side of the second active layer 12 and the fourth active layer 14 away from the third active layer 13, and the fifth active layer 15, the sixth active layer 16 and the seventh active layer 17 in the $(m-1)^{th}$ pixel row are located on one side of the third active layer 13 close to the $m^{th}$ pixel row:

Exemplarily, the first active layer 11 may be in an "n" shape, which is a double gate structure including two channel regions; the second active layer 12 may be in a "7" shape, which is a double gate structure including two channel regions; and the third active layer 13 may be in a "几" shape or an "I" shape, and the shape of each active layer can be selected according to process requirements, which is not limited in the present disclosure.

As shown in FIG. 7, the first conductive layer 2 includes a reset signal line 21, a first scan signal line 22, a light-emitting signal control line 23 and a first polar plate 24 of a storage capacitor C. The first conductive layer 2 may be called a first gate metal layer (Gate1 layer).

The reset signal line 21 that provides the first reset signal and the first scan signal line 22 that provides the first scan signal for the driving circuit of the $(m-1)^{th}$ row of sub-pixels are located on one side of the first polar plate 24 of the current pixel row away from the $m^{th}$ row of sub-pixels. The first scan signal line 22 is located on one side of the reset signal line 21 that provides the first reset signal to the current pixel row away from the first polar plate 24, and the light-emitting control signal line 23 may be located on one side of the first polar plate 24 of the current pixel row close to the $m^{th}$ row of sub-pixels.

Figure 14:
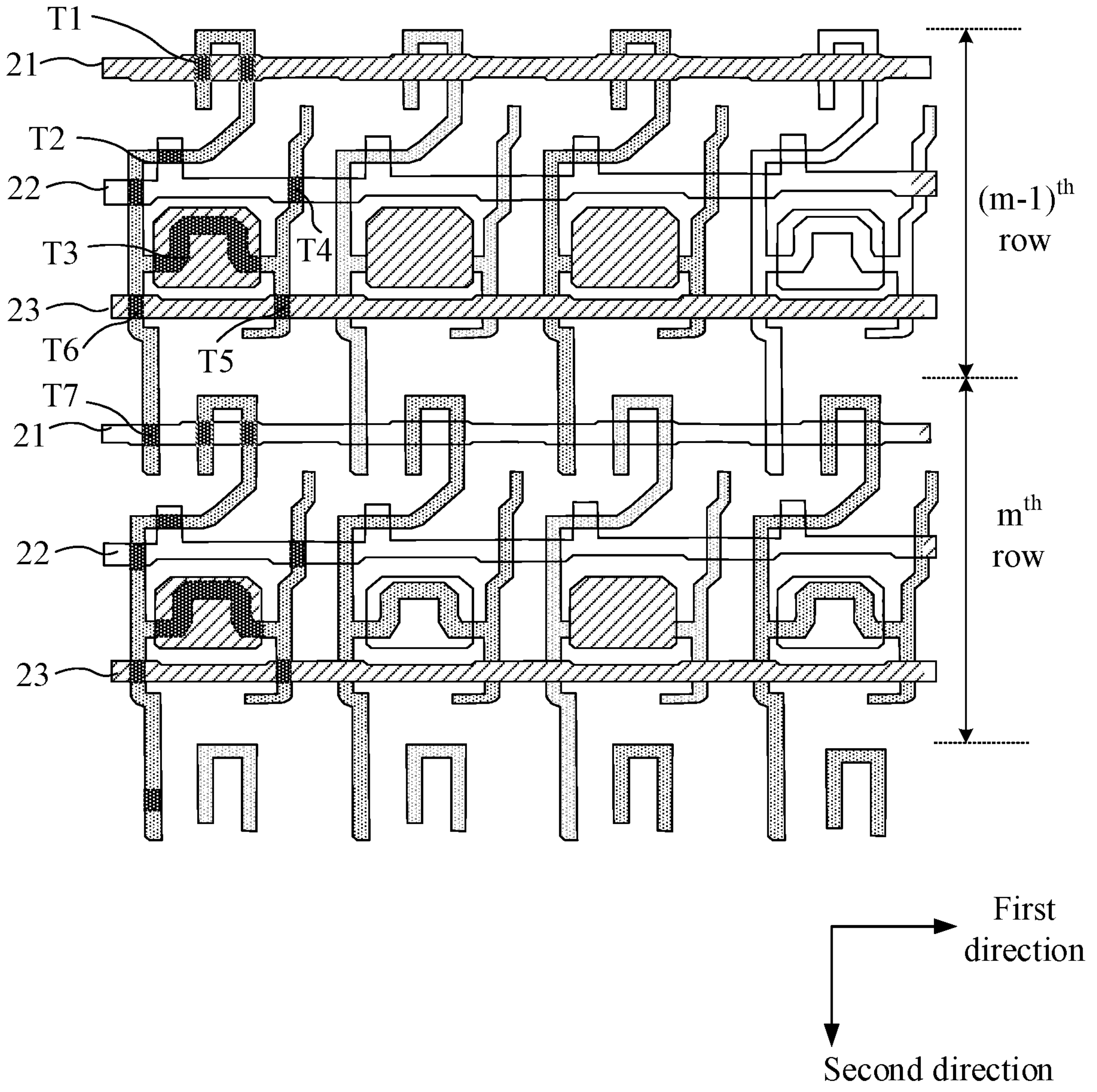
FIG. 14 is a schematic diagram of a laminated structure of a semiconductor layer and a first conductive layer of the display substrate in FIG. 5 and FIG. 11.

FIG. 14 shows a schematic diagram of a stacked structure of the semiconductor layer 1 and the first conductive layer 2. A region, on the first conductive layer 2, overlapped with a project of the semiconductor layer 1 on the base substrate may serve as a control electrode of each transistor. Specifically: part of the structure of the reset signal line 21 may be configured to form the control electrode (i.e., gate electrode) of the first reset transistor T1 and the control electrode (i.e., gate electrode) of the second reset transistor T7. For the reset signal line 21 that provides the first reset signal to the $m^{th}$ row of sub-pixels, part of the structure of the reset signal line 21 may constitute the control electrode of the first reset transistor T1 of the current pixel row and the control electrode of the second reset transistor T7 of the $(m-1)^{th}$ row. Part of the structure of the first scan signal line 22 may be configured to form the control electrodes (i.e., gate electrodes) of the second transistor T2 and the fourth transistor T4. The first scan signal line 22 includes a first protruding portion 221, and the first protruding portion 221 includes the control electrode of the second transistor T2. The light-emitting control signal line 23 may provide a light-emitting control signal for a light-emitting control signal terminal EM of the pixel circuit, and part of the structure of the light-emitting control signal line 23 may be configured to form the control electrodes (i.e., gate electrodes) of the fifth transistor T5 and the sixth transistor T6. The first polar plate 24 may simultaneously serve as the control electrode (i.e., gate electrode) of the driving transistor T3. The first polar plate 24 may be in a shape of a rounded rectangle, and a projection of the first polar plate on the base substrate and the projection of the driving transistor T3 on the base substrate have an overlapped region.

Specifically, a preparation process of a base substrate may include: a semiconductor layer 1 is deposited on the base substrate, and the semiconductor layer 1 is patterned to form an active layer of each transistor; an insulating layer film is deposited on the semiconductor layer 1, then a first conductive layer 2 is deposited on the insulating layer film, the first conductive layer 2 is patterned to form a reset signal line 21, a first scan signal line 22, a light-emitting control signal line EM, and a first polar plate 24; and conductorization treatment is performed on the semiconductor layer 1, a region shielded by the first conductive layer 2 forms channel regions of T1 to T7, and an unshielded first conductive layer 1 is conductorized, that is, the source-drain regions of T1 to T7 are all conductorized.

As shown in FIG. 8, the second conductive layer 3 includes: a first initialization signal line 31, a second initialization signal line 32, a shielding portion 33, a first conductive portion 34, and a second polar plate of a storage capacitor C, where the first conductive portion 34 is provided with a first through hole 341. Referring to FIG. 4 and FIG. 11, in one possible implementation, a projection of the second initialization signal line 32 on the base substrate overlaps with a projection of at least part of the source-drain region of the first transistor T1 on the base substrate. Specifically, when the first transistor T1 is a double-gate transistor, the second initialization signal line 32 shields a conductorization portion between two double gates of the first transistor T1 to prevent the conductorization portion between the double gates from being influenced by other parts of the pixel driving circuit, so as to improve the display effect.

Figure 12A:
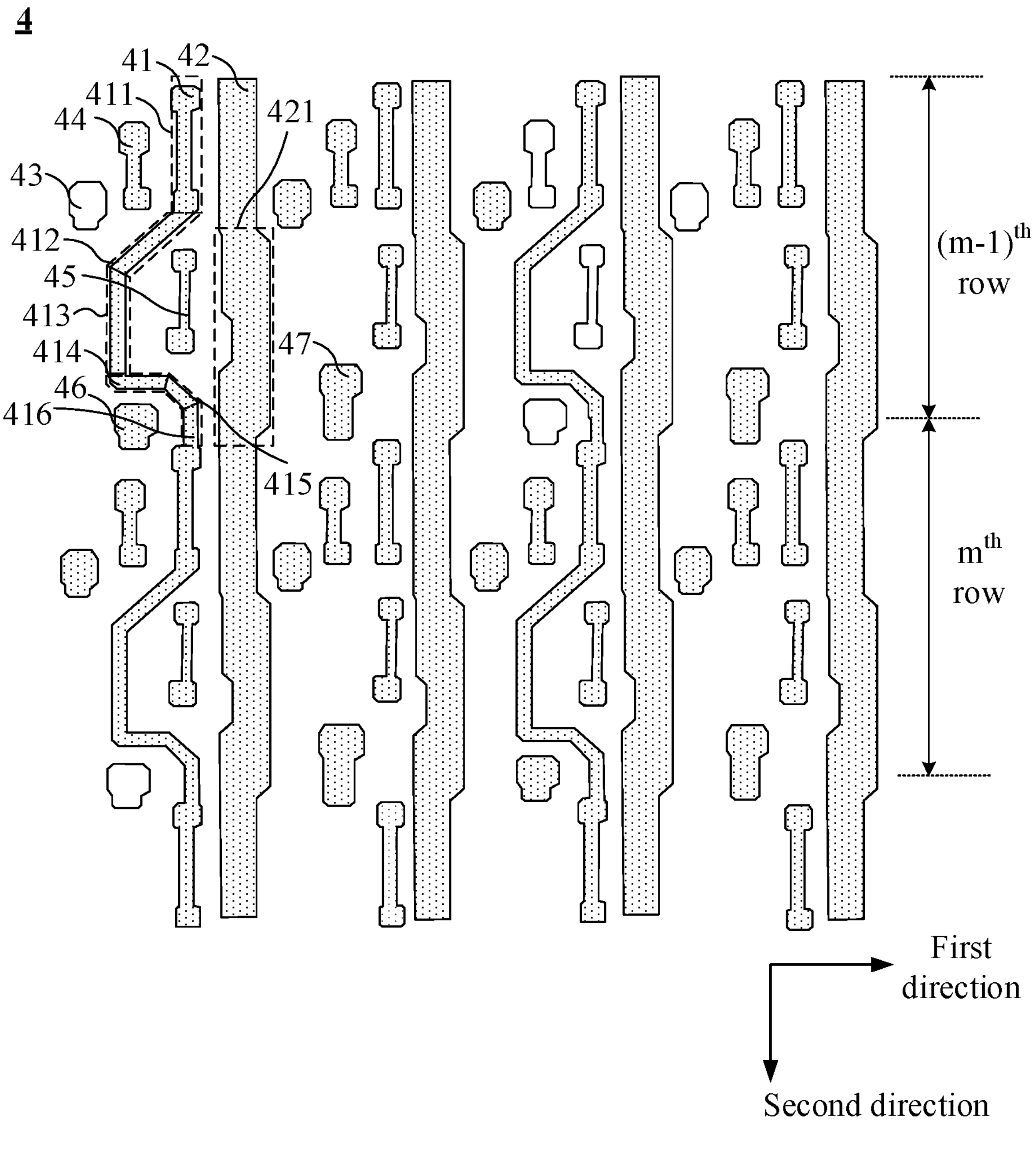
FIG. 12A is a schematic structural diagram of a third conductive layer of the display substrate in FIG. 11.
Figure 12B:
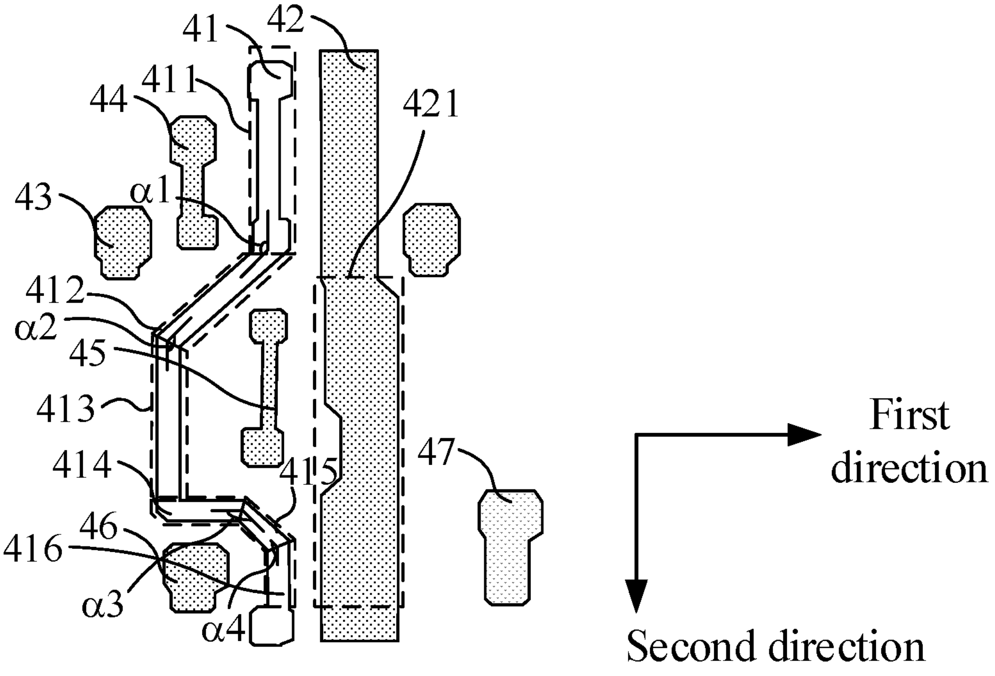
FIG. 12B is an enlarged view of a schematic structural diagram of a third conductive layer in one sub-pixel region in FIG. 11.

As shown in FIG. 12A and FIG. 12B, the third conductive layer 4 may include: a third initialization signal line 41, a first power supply line 42, a first connection portion 43, a second connection portion 44, a third connection portion 45, a fourth connection portion 46 and a fifth connection portion 47. The third initialization signal line 41 includes a first extension portion 411, a second extension portion 412 and a third extension portion 413 connected in sequence in the second direction. The first extension portion 411 extends in the second direction and is electrically connected with the first initialization signal line 31 through a via hole. An extension direction of the third extension portion 413 is different from an extension direction the first extension portion 411, and the second extension portion 412 is configured to connect the first extension portion 411 with the third extension portion 413. An extension direction of the second extension portion 412 deviates from the second direction.

Continuing to refer to FIG. 12A and FIG. 12B, in some possible implementations, the first extension portion 411 extends in the second direction, the second extension portion 412 and the first extension portion 411 are connected and have an included angle $\alpha 1$, where $90° < \alpha 1 < 180°$, for example, the included angle $\alpha 1$ may be 130° to 135°. The third extension portion 413 and the second extension portion 412 are connected and have an included angle α2, where 900<α2<180°, for example, the included angle α2 may be 125° to 135°.

In some possible implementations, continuing to refer to FIG. 12A and FIG. 12B, the third initialization signal line may further include a fourth extension portion 414, a fifth extension portion 415 and a sixth extension portion 416. The fourth extension portion 414 is connected with the third extension portion 413, a connection position between the fourth extension portion 414 and the third extension portion 413 may be of a chamfered or rounded structure, and the fourth extension portion 414 extends in the first direction. The fifth extension portion 415 and the fourth extension portion 414 are connected and have an included angle α3, where 90°<α3<180°, for example, the included angle α3 may be 125° to 135°. The sixth extension portion 416 is connected with the fifth extension portion 415, the sixth extension portion 416 extends in the second direction, the fifth extension portion 415 and the sixth extension portion 416 have an included angle α4, where 90°<α4<1800, for example, the included angle α4 may be 125° to 135°.

It should be noted that the above included angle of each extension portion refers to an included angle between line segments where the extension portion is located. Those skilled in the art can understand that in the actual process, an edge of each extension portion may not all be in regular straight lines as shown in FIG. 12A and FIG. 12B, but may be represented as wavy shapes, curved edge shapes or other irregular edge shapes allowed within the process error range. Therefore, it can also be understood that the above included angles may actually have some degree of deviation (e.g., ±10°).

Referring to FIG. 12, a projection of the first extension portion 413 on the base substrate has an overlapped region with each of projections of the reset signal line 21, the first initialization signal line 31 and the second initialization signal line 32 on the base substrate. The first extension portion 413 is further electrically connected with a first region of the first transistor T1 through a via hole, that is, the first extension portion 413 is connected with the first initialization signal line 31 to transmit the first initialization signal Vinit1 for forming a mesh structure, to reduce the transmission voltage drop. At the same time, the first extension portion 413 may transmit the first initialization signal Vinit1 to the first region of the first transistor T1, and then reset the first polar plate 24 of the storage capacitor C and the control electrode of the driving transistor.

Referring to FIG. 11 and FIG. 12, a projection of the second extension portion 412 on the base substrate has an overlapped part with a projection of the first protruding portion 221 on the base substrate, and a projection of the shielding portion 33 on the base substrate. The second extension portion 412 and the first extension portion 411 form the included angle α1. Reasonably setting the included angle between the second extension portion 412 and the first extension portion 411 can avoid the pixel circuit, and minimize parasitic capacitance to the greatest extent under the premise of reasonably occupying the space of the base substrate. In the first direction, a projection of the third extension portion 413 on the base substrate is located on one side of the projection of the driving transistor T3 on the base substrate away from a projection of the first power supply line 42 on the base substrate.

Continuing to refer to FIG. 11 and FIG. 12, the second connection portion 44 is connected with the second initialization signal line 32 through a via hole, and is connected with a first region of the second reset transistor T7 to transmit a second initialization signal Vinit2 to the first electrode of the light-emitting device, to reset the first electrode. A first end of the third connection portion 45 is connected with the control electrode of the driving transistor T3 through a via hole, and the second end is connected with a first region of the second transistor T2 through a via hole.

Continuing to refer to FIG. 12, the first power supply line 42 may include a plurality of seventh extension portions 421. The seventh extension portions 421 may include parts bent in the first direction. A width of the seventh extension portions 421 in the first direction is greater than a width of other positions of the first power supply line 42 in the first direction. The seventh extension portions 421 are electrically connected with a first region of the fifth transistor T5 and the first conductive portion 34, so as to transmit a Vdd signal to the first conductive portion 34 to provide a first power supply voltage signal to the second polar plate of the storage capacitor and the driving transistor. At the same time, the first conductive portion 34 may be connected laterally in the first direction through the seventh extension portions 421, so as to reduce the voltage drop of the first power supply voltage transmission and improve the display effect.

As shown in FIG. 10, the fourth conductive layer 5 includes a data signal line 51, a second power supply line 52, a sixth connection portion 54, a seventh connection portion 55, an eighth connection portion 56 and a flat portion 53. The flat portion 53 further includes a first color flat portion 531, a second color flat portion 532 and a third color flat portion 533. The data signal line 51 is configured to transmit the data voltage signal Vdata to the data signal terminal DATA of the pixel driving circuit. The data signal line 51 is connected with the first connection portion 43 through the sixth connection portion 54, and the first connection portion 43 is connected with a first region 142 of the fourth transistor T4.

In one possible implementation, referring to FIG. 11 and FIG. 12, the shielding portion 33 is connected with the first power supply line 42 through a via hole, a projection of the shielding portion 33 on the base substrate covers the source-drain region of the second transistor T2, and the projection of the shielding portion 33 on the base substrate does not overlap with a projection of the data signal line 51 on the base substrate. That is, the shielding portion 33 shields a conductorization region of the second transistor T2. Further, when the second transistor T2 is of a double gate structure, the projection of the shielding portion 33 on the base substrate covers a projection of the conductorized part between the double gates of the second transistor T2 on the base substrate. Under coupling of other conductive structures, a potential of the conductorized part is easily changed, which leads to electric leakage to a source or drain of the second transistor T2. Therefore, when the shielding portion 33 has Vdd voltage, it is beneficial to prevent floating connection (Floating) of the conductorized part, play a certain role in voltage stabilization and improve the picture quality. However, at the same time, the projection of the shielding portion 33 on the base substrate does not overlap with the projection of the data signal line 51 on the base substrate, thereby reducing the parasitic capacitance between the data signal line 51 and the shielding portion 33, meanwhile, the shielding portion 33 plays the role in voltage stabilization, which can prevent data voltage changes of the adjacent columns of pixels from affecting the sub-pixels and improve the picture quality.

The second power supply line 52 and the first power supply line 42 are electrically connected with the seventh extension portions 421 via an eighth connection portion 56, and specifically, may be connected through a via hole. That is, the second power supply line 52 and the first power supply line 51 are connected in parallel, which can significantly reduce the voltage drop of the Vdd signal in the transmission process and improve the display effect.

In one possible implementation, a projection of the second power supply line 52 on the base substrate and a projection of the first power supply line 42 on the base substrate at least partially overlap, and further, a width of the second power supply line 52 in the first direction is smaller than the width of the seventh extension portions 421 in the first direction.

The seventh connection portion 55 is connected with the fourth connection portion 46 and the fifth connection portion 47 through via holes, the fourth connection portion 46 and the fifth connection portion 47 are connected with a second region of the sixth transistor T6 through via holes, and the shapes of the fourth connection portion 46 and the fifth connection portion 47 may be different. For example, as shown in FIG. 12, a length of the fifth connection portion 47 in the second direction is greater than a length of the fourth connection portion 46. In one possible implementation, the fourth connection portion 46 and the first initialization signal line 41 are disposed in the same pixel column. Of course, the shapes of the fourth connection portion 46 and the fifth connection portion 47 may also be the same.

Continuing to refer to FIG. 10, the fourth conductive layer further includes a flat portion 53. The flat portion 53 is connected with the second power supply line 52, that is, a potential of the flat portion 53 is the Vdd signal. The flat portion 53 is connected with the second power supply line 52, so that resistance of the second power supply line can be reduced, the voltage drop of the second power supply signal line 52 from the first end to the second end is reduced, the signal transmission loss is reduced, and the display effect is improved.

Figure 15:
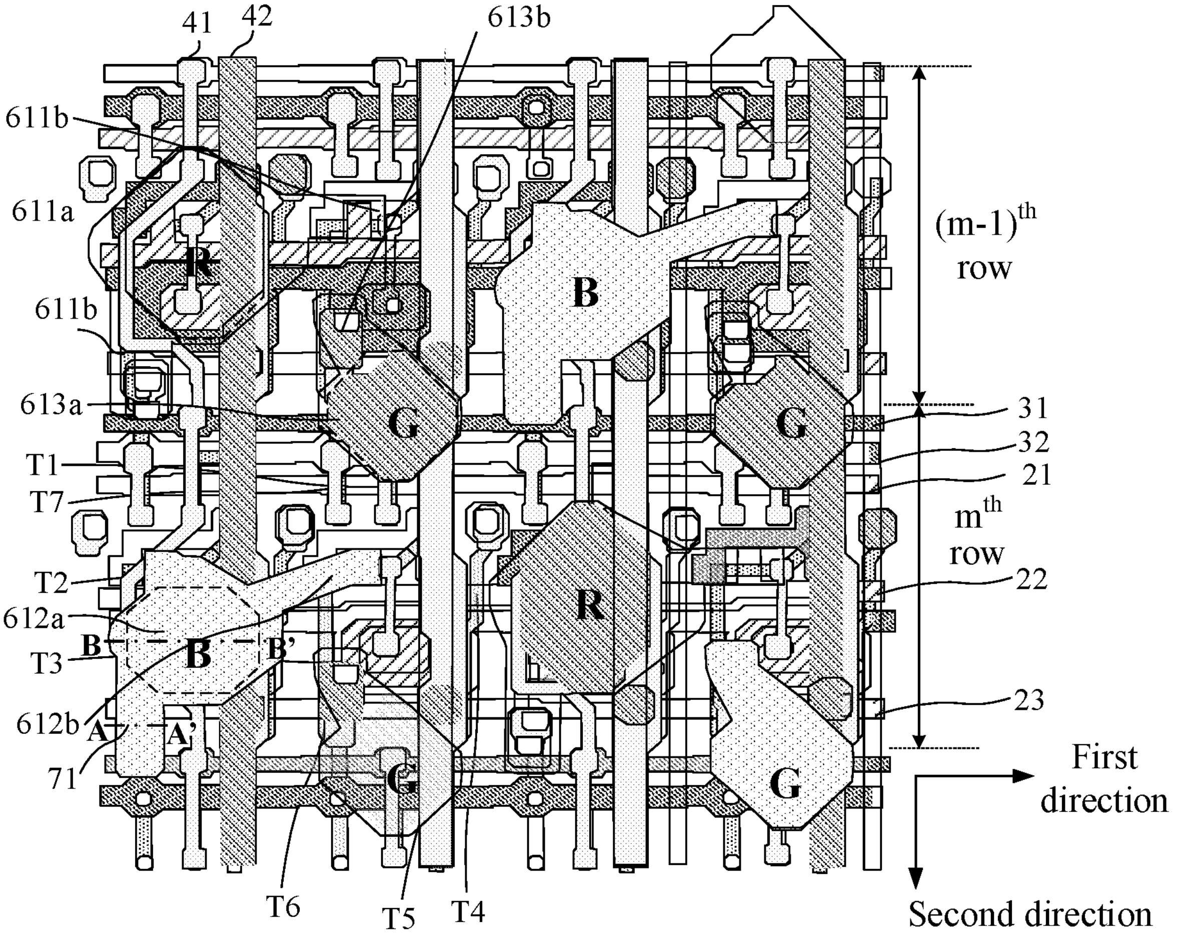
FIG. 15 is a schematic diagram of a laminated structure of the structure in FIG. 11 and a five conductive layer.

Referring to FIG. 15, in one possible implementation, a projection of the flat portion 53 on the base substrate at least partially overlaps with a projection of the first electrode of the light-emitting device on the base substrate, and the first electrode may be an anode. The flat portion 53 may be configured to improve flatness of the first electrode, improve color shift, and improve the display effect. Further, in other possible implementations, the projection of the first electrode of the light-emitting device on the base substrate completely covers the projection of the flat portion 53 on the base substrate. In the present disclosure. “the projection of A completely covers B” means that a contour of the projection of B in a certain plane is completely located inside a contour of the projection of A in the same plane.

Continuing to refer to FIG. 10, in one possible implementation, the shapes of the flat portions 53 of the sub-pixels that emit light with different colors may be different, for example, the flat portion may include the first color flat portion 531, the second color flat portion 532 and the third color flat portion 533. Of course, the shapes of the flat portion 53 may also be the same.

Referring to FIG. 10, in one possible implementation, an area of the first color flat portion 531 is greater than an area of the second color flat portion 532 and an area of the third color flat portion 533.

In one possible implementation, referring to FIG. 1A and FIG. 1B, the plurality of sub-pixels include a first color sub-pixel P1, a second color sub-pixel P2 and a third color sub-pixel P3 emitting light with different colors. The first color sub-pixel P1 may be a red sub-pixel (R) emitting red light, and a pixel driving circuit of the sub-pixel P1 is electrically connected with a first electrode of the light-emitting device emitting the red light. The second color sub-pixel P2 may be a blue sub-pixel (B) emitting blue light, and a pixel driving circuit of the sub-pixel P2 is electrically connected with a first electrode of the light-emitting device emitting the blue light. The third color sub-pixel P3 may be a green sub-pixel (G) emitting green light, and a pixel driving circuit of the sub-pixel P3 is electrically connected with the first electrode of the light-emitting device emitting the green light.

Continuing to refer to FIG. 1A and FIG. 1B, the plurality of sub-pixels P include red sub-pixels R emitting red light, blue sub-pixels G emitting blue light, and green sub-pixels B emitting green light which are arranged in an array to form a plurality of pixel rows and a plurality of pixel columns. The plurality of sub-pixel columns include red-blue pixel columns RB and green pixel columns GG; the red-blue pixel columns RB include the red sub-pixels R and the blue sub-pixels B disposed alternately in the second direction; and the green pixel columns GG include the green sub-pixels G disposed in sequence in the second direction.

In one possible implementation, the third initialization signal line 41 is only disposed in the red-blue pixel columns RB. In another possible implementation, the third initialization signal line 41 is only disposed in the green-green pixel columns GG. In another possible implementation, the third initialization signal line 41 may be simultaneously disposed in the red-blue pixel columns RB and the green pixel columns GG.

In one possible implementation, a shape of the third initialization signal line 31 located in the $n^{th}$ column of red-blue pixel columns RB may be the same as a shape of the third initialization signal line 31 located in the $(n+1)^{th}$ column, where n is a positive integer greater than or equal to 1 and less than or equal to N.

Figure 16:
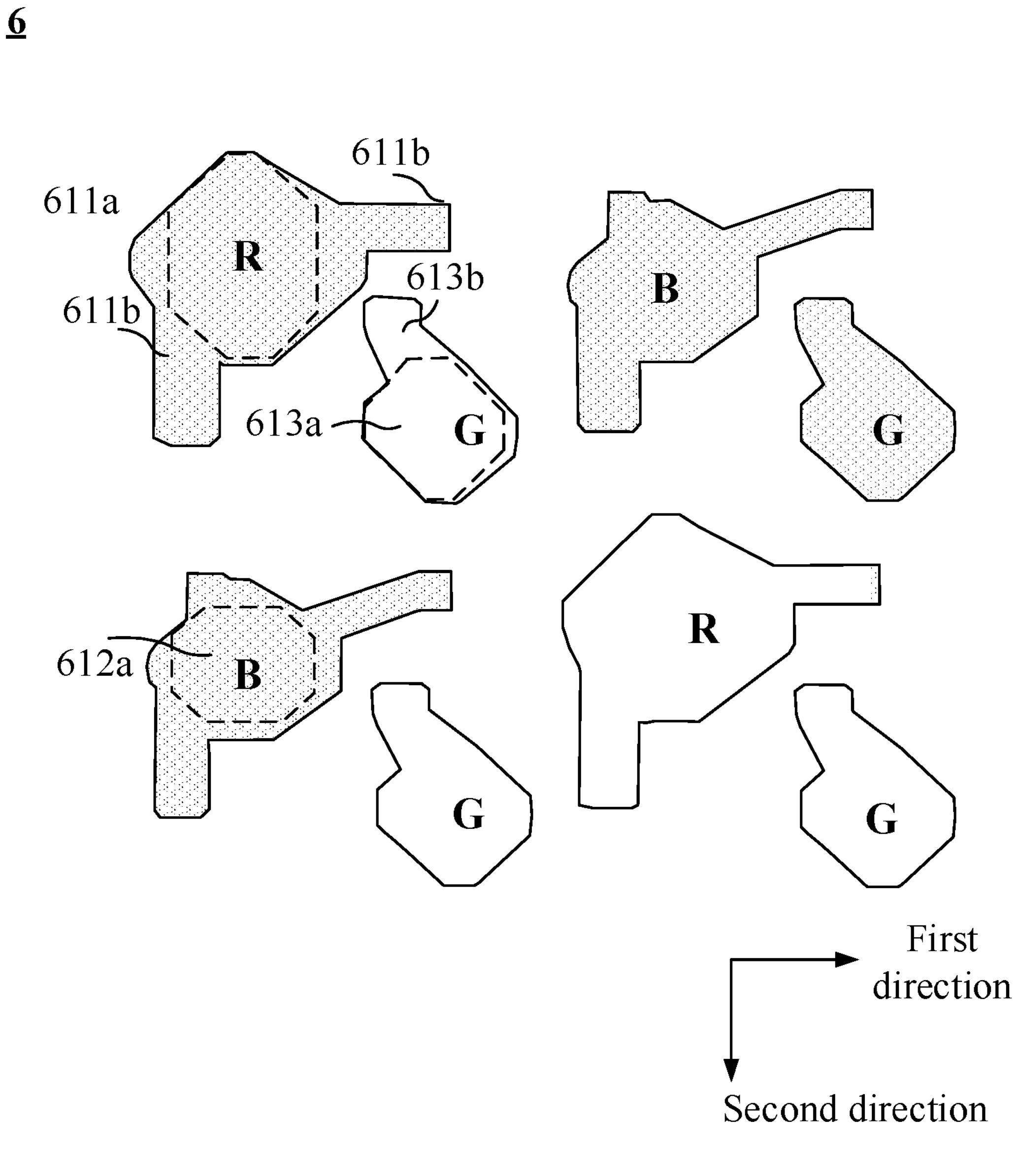
FIG. 16 is a schematic structural diagram of a fifth conductive layer of the display substrate in FIG. 15.

In one possible implementation, the display substrate further includes a fifth conductive layer 6, as shown in FIG. 16, the fifth conductive layer 6 includes a first electrode 61 of each sub-pixel. Specifically, a first electrode 611, a second electrode 612 and a third electrode 613 are respectively disposed in the first color sub-pixel, the second color sub-pixel and the third color sub-pixel.

Figure 17:
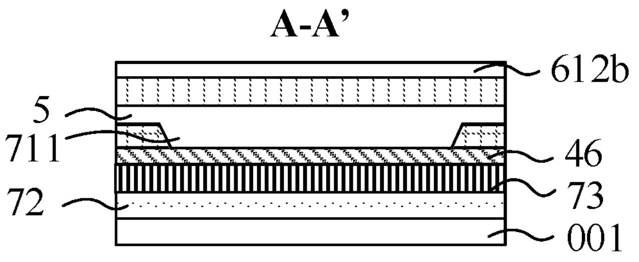
FIG. 17 is a schematic diagram of a sectional structure of A-A' in FIG. 15.

As shown in FIG. 17, the display substrate further includes a first insulating layer 7, the third conductive layer 5 is located on one side of the first insulating layer 7 facing the base substrate, the first insulating layer 7 includes a first via hole 711, the first via hole 711 exposes the fourth connection portion 46 and the fifth connection portion 47.

The first electrode 61 includes a main body part 61*a* and an auxiliary part 61*b*. The auxiliary part 61*b* is electrically connected with the third conductive layer 4 through the first via hole 711. In the embodiment of the present disclosure, the main body part 61*a* and the auxiliary part 61*b* in the same sub-pixel are of an integral structure, and may be formed simultaneously by employing one composition process.

Figure 18:
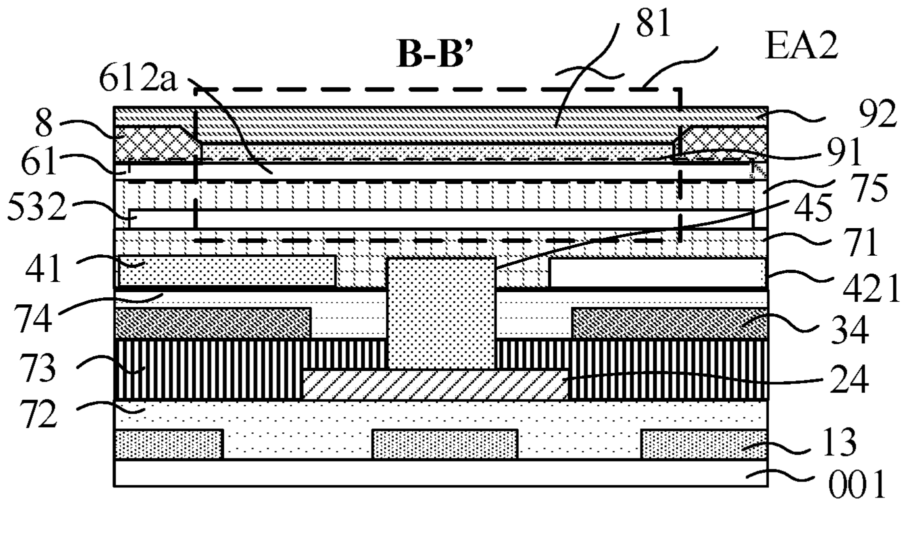
FIG. 18 is a schematic diagram of a sectional structure of B-B' in FIG. 15.

As shown in FIG. 18, the display substrate further includes a pixel defining layer 8, a light-emitting layer 91 located on one side of the fifth conductive layer 6 facing away from the base substrate, and a cathode 92 located on one side of the light-emitting layer 91 facing away from the fifth conductive layer 6. The pixel defining layer has an opening 81 that exposes at least a partial region of the main body part of the first electrode, the light-emitting layer 81 is located in the opening 81 and is in contact with the region of the main body part exposed by the opening, and a region where the light-emitting layer is located in the opening may be configured to emit light, so that an effective light-emitting region EA may be defined by the opening. In other words, the partial region where the opening of the pixel defining layer 8 overlaps with the main body part 61*a* of the first electrode 61 is the effective light-emitting region EA of each sub-pixel. Specifically, as shown in FIG. 18, in one possible implementation, an overlapped region of the opening of the pixel defining layer 8 in the second color sub-pixel P2 and the main body part of the first electrode 612 is an effective light-emitting region EA2 of the second color sub-pixel P2. Similarly, an overlapped region of the opening of the pixel defining layer 8 in the first color sub-pixel P1 and the main body part 611*a* of the first electrode 611 is an effective light-emitting region EA1 of the first color sub-pixel P1, and an overlapped region of the opening of the pixel defining layer 8 in the third color sub-pixel P3 and the main body part of the first electrode 613 is an effective light-emitting region EA3 of the third color sub-pixel P3.

In one possible implementation, the flat portion 53 is located on one side of the first electrode 61 close to the base substrate. As shown in FIG. 15 and FIG. 16, a shape of the first color flat portion 531 is substantially the same as a shape of the main body part 611*a* of the first electrode 611 of the first color sub-pixel, a shape of the second color flat portion 532 is substantially the same as a shape of the main body part 612*a* of the first electrode 612 of the second color sub-pixel, and a shape of the third color flat portion 533 is substantially the same as a shape of the main body part 613*a* of the first electrode 613 of the third color sub-pixel.

In the present disclosure. "A and B have substantially the same shape" means that contour lines of A and B have the same shape, and an area difference between A and B does not exceed ±1%.

In other words, the shape of all the flat portions corresponds to the shape of all the first electrodes above the flat portions, which helps to achieve uniform flatness of each part of each first electrode, and eliminates asymmetry, thereby improving or even eliminating the color shift.

In one possible implementation, the area of the main body parts of the first electrodes of the sub-pixels with different colors may be different. For example, the area of the main body part 611*a* of the first electrode of the first color sub-pixel may be greater than the area of the main body part 612*a* of the first electrode of the second color sub-pixel and the area of the third color sub-pixel 613*a*. Of course, the area of each color main body part may also be the same, or set according to the required size, which is not limited in the present disclosure.

As shown in FIG. 15 and FIG. 16, the shape of the main body part 61*a* of the first electrode 61 may be an octagon, and correspondingly, the shape of each flat portion 53 may also be an approximate octagon. The first color flat portion 531 includes a first sunken portion 5311, the first sunken portion 5311 is configured to avoid the via hole for electrical connection between the eighth connection portion 56 and the seventh extension portion 421; and the third color flat portion 533 includes a second sunken portion 5331, and the second sunken portion 5331 is configured to avoid the via hole for electrical connection between the seventh connection portion 55 and the fifth connection portion 47. In other possible implementations, the shape of the main body part 61*a* may be a hexagon, a rectangle or other shapes, which is not limited in the present disclosure.

In one possible implementation, the projection of the flat portion 53 of each sub-pixel on the base substrate at least partially overlaps with the projection of the first electrode 61 of the corresponding sub-pixel on the base substrate. Specifically, the projection of the first color flat portion 531 on the base substrate at least partially overlaps with the projection of the first electrode 611 of the first color sub-pixel on the base substrate, the projection of the second color flat portion 532 on the base substrate at least partially overlaps with the projection of the first electrode 612 of the second color sub-pixel on the base substrate, and the projection of the third color flat portion 533 on the base substrate at least partially overlaps with the projection of the first electrode 613 of the third color sub-pixel on the base substrate. That is, the side of the first electrode of each different color sub-pixel close to the base substrate has the flat portion, so that the first electrode of each sub-pixel can be flat, the color shift is reduced, and the uniformity of the displayed picture is improved.

Further, in one possible implementation, the projection of the first electrode 611 of the first color sub-pixel on the base substrate completely covers the projection of the first color flat portion 531 on the base substrate, the projection of the first electrode 612 of the second color sub-pixel on the base substrate completely covers the projection of the second color flat portion 532 on the base substrate, and the projection of the first electrode 613 of the third color sub-pixel on the base substrate completely covers the projection of the third color flat portion 533 on the base substrate. Usually, thicknesses of the signal lines made by the third conductive layer 4 and the fourth conductive layer 5 located on one side of the first electrode close to the display substrate, such as the first power supply line 42 and the second power supply line 52, are large in a direction perpendicular to the base substrate. The insulating layer above the signal lines cannot be completely flattened, so that the light-emitting layer above the flat layer is uneven, and the first electrode 61 and the light-emitting layer above the first electrode 61 appear asymmetrical protrusions, which in turn leads to color shift occurring when viewed from the left and right sides of a normal line of the display substrate at the same angle as the display substrate. The flat portions are disposed under the first electrodes of the different sub-pixels, and the flat portions are completely located inside the projections of the first electrodes, so that the corresponding positions of the first electrodes of each sub-pixel can be flattened, thereby further improving the color shift.

In one possible implementation, the projection of the flat portion 53 on the base substrate and the projection of the first power supply line 41 on the base substrate have an overlapped part. Specifically, in the embodiment shown in the present disclosure, the projection of the flat portion 53 on the base substrate at least partially overlaps with the seventh extension portion 421 of the first power supply line 42. Such disposing reduces the voltage drop of transmission of the first power supply voltage on the signal line, and improves the uniformity of the displayed picture.

Referring to FIG. 1A and FIG. 15, in one possible implementation, the first color sub-pixel may be the red sub-pixel R emitting the red light, and the second color sub-pixel may be the blue sub-pixel B emitting the blue light. Correspondingly, the first color flat portion 531 and the second color flat portion 532 at least partially overlap with the seventh extension portion 421.

Continuing to refer to FIG. 15, in one possible implementation, the first color sub-pixel may be the red sub-pixel R emitting the red light, and the second color sub-pixel may be the blue sub-pixel B emitting the blue light. At this time, the projections of the first color flat portion 531 and the second color flat portion 532 on the base substrate at least partially overlap with the projection of the control electrode 24 of the driving transistor T3 on the base substrate, which can stabilize the potential of the first node N1.

Continuing to refer to FIG. 15, in one possible implementation, the third color sub-pixel may be a green sub-pixel G emitting the green light. At this time, the projection of the third color flat portion 533 on the base substrate at least partially overlapped with the projections of the source-drain region and/or the channel region of the first transistor T1 on the base substrate. Specifically, when the first reset transistor T1 is a dual-gate transistor, the third color flat portion 533 shields the conductorized part between the double gates of the first reset transistor T1, which can play a role in reducing leakage current. In another possible implementation, the first reset transistor T1 may further be an oxide transistor (IGZO). At this time, the third color flat portion 533 shields the oxide transistor T1, which can further avoid the influence of illumination on performance of the transistor.

Continuing to refer to FIG. 1A and FIG. 15, in one possible implementation, the first color sub-pixel, the second color sub-pixel, and the third color sub-pixel respectively emit the red light, the blue light and the green light. The plurality of red sub-pixels R and blue sub-pixels B are alternately arranged in the second direction to form RB pixel columns, and the plurality of green sub-pixels G are alternately arranged in the second direction to form green pixel columns GG. The red-blue pixel columns RB and the green pixel columns GG are alternately arranged in the first direction, wherein a projection of the auxiliary part 611*b* of the first electrode of the red sub-pixel R on the base substrate at least partially overlaps with the projection of the source-drain region of the second transistor T2 of the adjacent green sub-pixel G on the base substrate. When the second transistor T2 is of the double gate structure, the overlapped position is located in the conducorized region between the double gates, so as to reduce the electrical leakage of the second transistor T2 and improve the uniformity of the displayed picture. Similarly, the projection of the auxiliary part of the first electrode of the blue sub-pixel G on the base substrate at least partially overlaps with the projection of the source-drain region of the second transistor T2 of the adjacent green sub-pixel G on the base substrate, and the principle and technical effect are the same, and are not repeated herein.

In one possible implementation, the display substrate may further include: a light-shading layer (not shown in the figure). The light-shading layer may be located between the base substrate and the semiconductor layer 1, and a projection of the light-shading layer on the base substrate at least covers a projection of an active region of one transistor in the plurality of transistors on the base substrate. For example, the projection of the light-shading layer on the base substrate can cover the projection of the channel region of the driving transistor T3 on the base substrate to shield external light and external interference, thereby avoid affecting the performance of the active layer of each transistor, and improving the display effect.

Further, in one possible implementation, the light-shading layer may be a semiconductor material (a-Si) or a metal material (Mo). The light-shading layer may be electrically connected with a constant potential to prevent the light-shading layer from being in a floating state, and have a better anti-interference effect on the channel region of the active layer. Specifically, the light-shading layer may be electrically connected with the first power supply line 41, and may also be electrically connected with the first initialization signal line 31 or the second initialization signal line 32.

In another possible implementation, the light-shading layer may only include a first connection structure extending in the first direction, or may only include a second connection structure extending in the second direction, or may simultaneously include the first connection structure extending in the first direction and the second connection structure extending in the second direction.

The first connection structure and the second connection structure may each be connected in a mesh with the structure to which they are electrically connected, so as to significantly reduce loading. For example, the first connection structure may be electrically connected with the first power supply line 42 and be of a mesh structure. For another example, the first connection structure may be electrically connected with the third initialization signal line 41 and be of a mesh structure. For another example, the second connection structure may be electrically connected with the first initialization signal line 31 or the second initialization signal line 32 and be of a mesh structure. For another example, the second connection structure may be connected in parallel with the third initialization signal line 41, and the second connection structure may be located only in the red-blue pixel columns, only in the green-green pixel columns, or in both the red-blue pixel columns and the green-green pixel columns. For another example, the first connection structure and the second connection structure may be connected in a mesh shape, that is, the light-shading layer itself may be in a mesh shape.

Figure 19A:
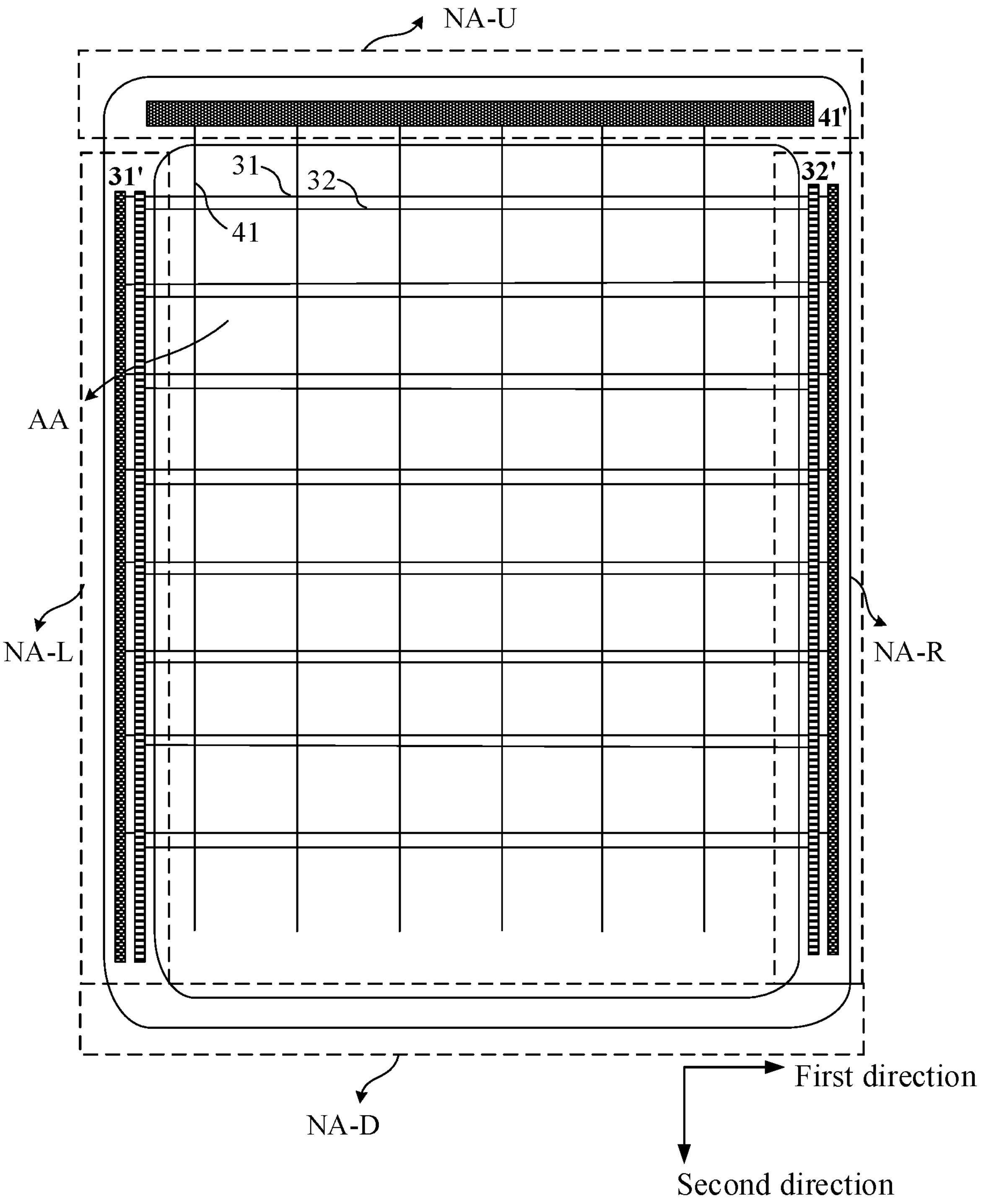
FIG. 19A, FIG. 19B and FIG. 19C are schematic structural diagrams of partial wirings in a peripheral region in FIG. 11.

As shown in FIG. 1A and FIG. 19A, the display substrate includes a display region AA and a peripheral region NA located outside the display region. The peripheral region NA may include a left border region NA-L, a right border region NA-R, an upper border region NA-U and a lower border region NA-D. In one possible implementation, the left border region NA-L and the right border region NA-R are respectively provided with a first initialization signal line bus 31' and a second initialization signal line bus 32' extending in the second direction. The plurality of first initialization signal lines 31 are electrically connected with the first initialization signal line bus 31', and the plurality of second initialization signal lines 32 are electrically connected with the second initialization signal line bus 32'. Meanwhile, the upper border region NA-U and/or the lower border region NA-D may be provided with a third initialization signal line bus 41' extending in the first direction and electrically connected with the plurality of third initialization signal lines 41. Each initialization signal line bus provides an initialization signal for the corresponding initialization signal line.

Figure 19B:
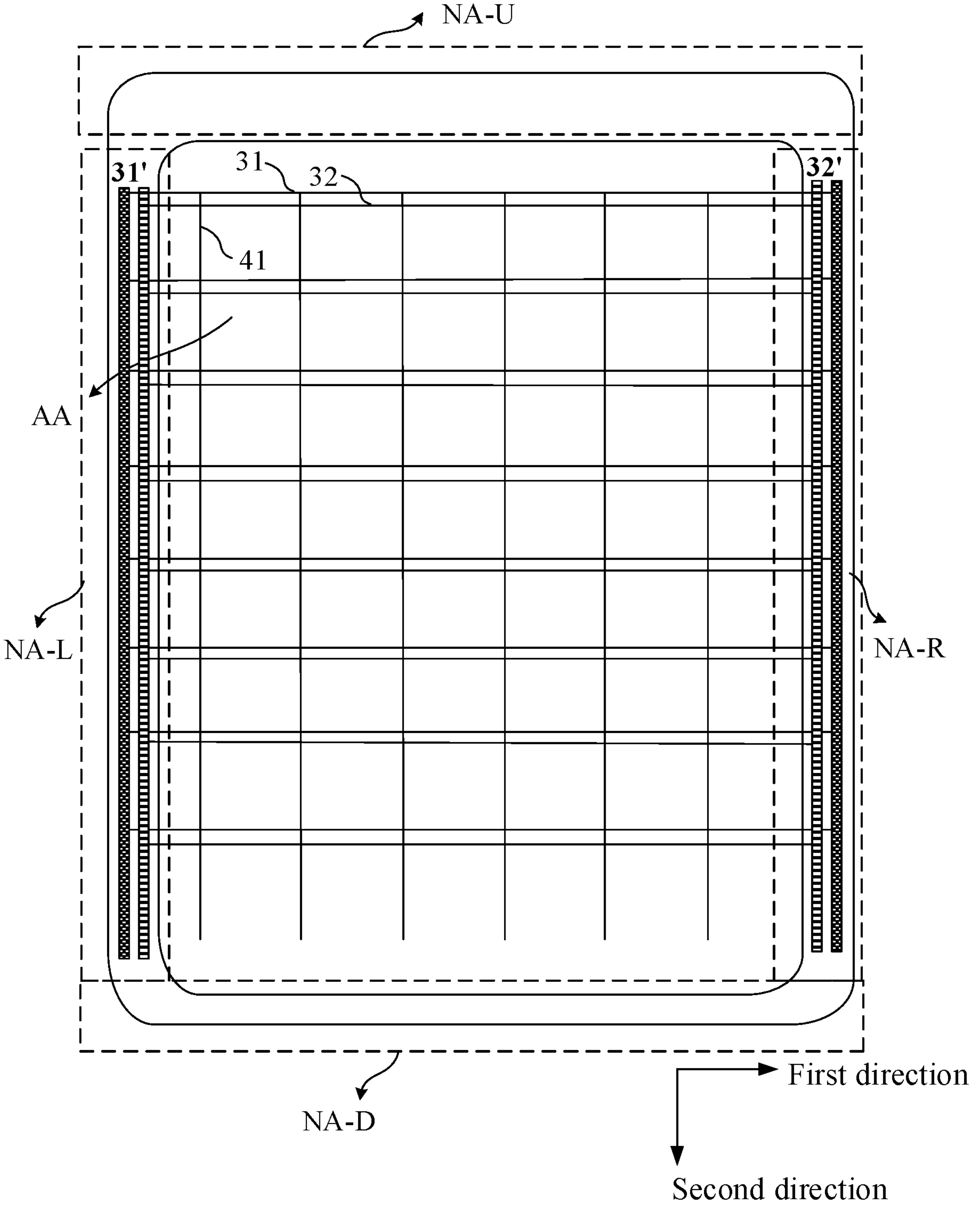

In another possible implementation, as shown in FIG. 19B, the left border region NA-L and the right border region NA-R are respectively provided with the first initialization signal line bus 31' and the second initialization signal line bus 32' extending in the second direction. The plurality of first initialization signal lines 31 are electrically connected with the first initialization signal line bus 31', and the plurality of second initialization signal lines 32 are electrically connected with the second initialization signal line bus 32'.

Figure 19C:
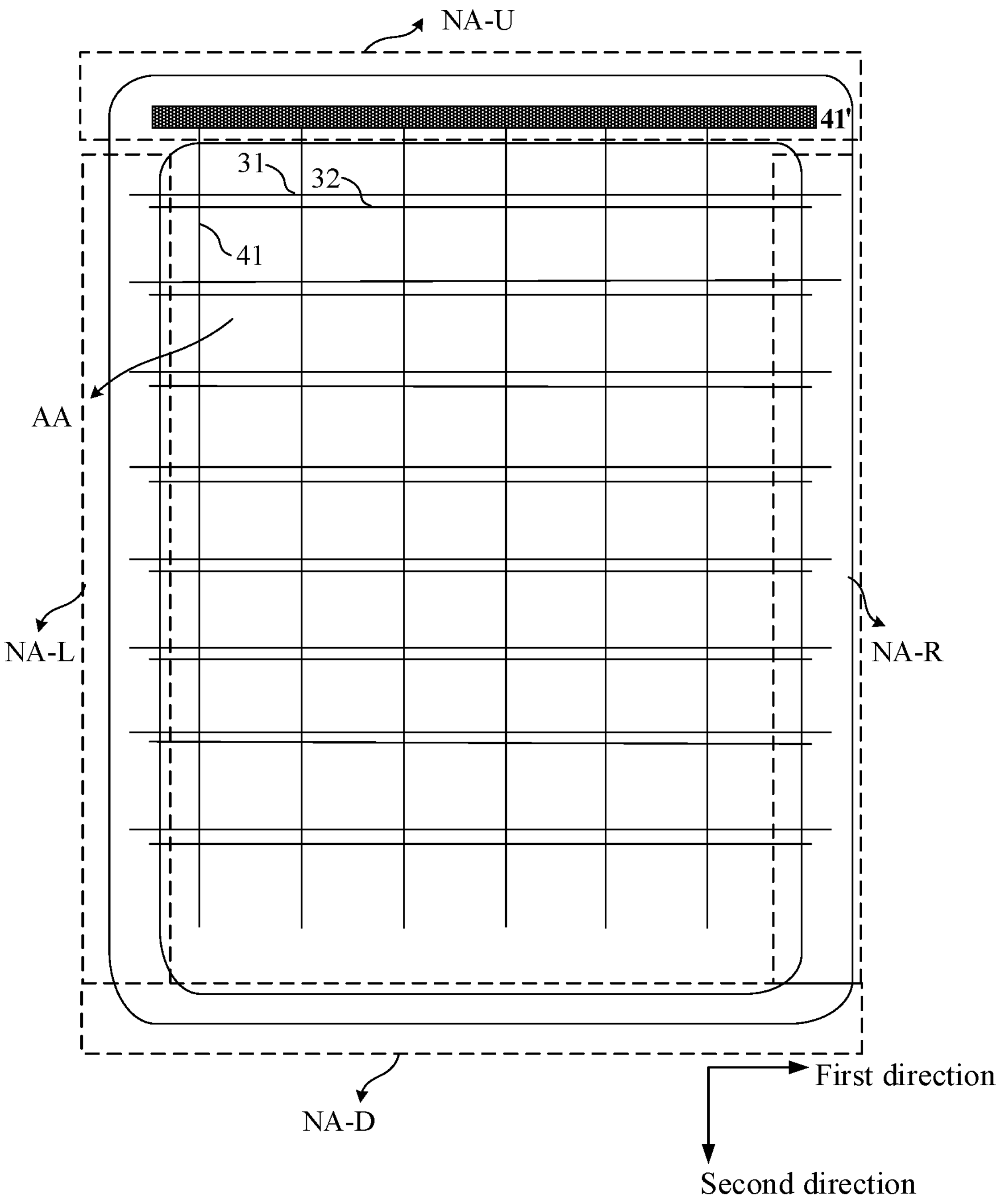

In another possible implementation, as shown in FIG. 19C, the upper border region NA-U and/or the lower border region NA-D may be provided with the third initialization signal lines bus 41' extending in the first direction and electrically connected with the plurality of third initialization signal lines 41 to provide the corresponding initialization signal for the third initialization signal lines.

In one possible implementation, the first initialization signal line bus 31', the second initialization signal line bus 32', and the third initialization signal line bus 41' may be located in the same film layer, for example, may be all located in the third conductive layer 4 or all located in the fourth conductive layer 5. Of course, they may also be located in the different film layers. For example, the first initialization signal line bus 31' may be located in the third conductive layer 4, and the second initialization signal line bus 32' and the third initialization signal line bus 41' may be located in the fourth conductive layer 5, which may be designed according to specific needs, and is not limited in the present disclosure.

The present disclosure further provides a display apparatus, including the above display panel. The display apparatus may be a display apparatus such as a mobile phone and a tablet computer.

The present disclosure further provides a method for manufacturing a display substrate, at least including S1 to S7.

S1: a semiconductor layer 1 is deposited on a base substrate, and the semiconductor layer 1 is patterned to form an active layer of each transistor; and a first active layer 11 to a seventh active layer 17 are of an interconnected integral structure.

S2: a second insulating layer 72 is deposited on the semiconductor layer 1, then a first conductive layer 2 is deposited on the second insulating layer 72, the first conductive layer 2 is patterned to form a reset signal line 21, a first scan signal line 22, a light-emitting control signal line EM, and a first polar plate 24. As shown in FIG. 7, the first metal layer may also be called a gate metal layer (Gate1 layer).

S3: conductorization treatment such as ion implantation is performed on the semiconductor layer 1, a region shielded by the first conductive layer 2 forms channel regions of a first reset transistor T1, a second transistor T2, a driving transistor T3, a fourth transistor T4, a fifth transistor T5, a sixth transistor T6 and a second reset transistor T7, the semiconductor layer 1 that is not shielded is conductorized, that is, source-drain regions of the seven transistors T1 to T7 are all conductorized.

S4: a third insulating layer 73 is deposited on the first conductive layer 2, a second conductive layer 3 is deposited over the insulating layer and patterned, the second conductive layer 3 includes a first initialization signal line 31, a second initialization signal line 32, a shielding portion 33, and a first conductive portion 34, and the second conductive layer may also be a second gate metal layer (Gate2 layer).

S5: a third insulating layer 74 is deposited on the second conductive layer 3, a third conductive layer 4 is deposited over the third insulating layer and patterned, and the third conductive layer at least includes a third initialization signal line 41, a first power supply line 42, a first connection portion 43, a second connection portion 44, a third connection portion 45, a fourth connection portion 46 and a fifth connection portion 47.

S6: a first insulating layer 71 is deposited over the third conductive layer 4, a fourth conductive layer 5 is deposited on the first insulating layer 71 and patterned, the fourth conductive layer 5 at least includes a data signal line 51, a second power supply line 52, and a flat portion 53.

S7: a fourth insulating layer 75 is deposited on the fourth conductive layer 5, a fifth conductive layer 6 is deposited over the fourth insulating layer 75 and patterned to form a first electrode pattern of a sub-pixel.

The subsequent preparation flow may include: an organic light-emitting layer is formed by employing an inkjet printing or evaporation process, the organic light-emitting layer is connected with the first electrode through an opening of a pixel defining layer, a second electrode is formed on the organic light-emitting layer, and the second electrode is connected with the organic light-emitting layer. An encapsulation layer is formed. The encapsulation layer may include a first encapsulation layer, a second encapsulation layer and a third encapsulation layer which are stacked. The first encapsulation layer and the third encapsulation layer may adopt an inorganic material, and the second encapsulation layer may adopt an organic material. The second encapsulation layer is disposed between the first encapsulation layer and the third encapsulation layer to be capable of preventing outside water vapor from invading a light-emitting structure.

In an exemplary implementation, the base substrate may be a flexible substrate, or may be a rigid substrate. The rigid substrate may be, but not limited to, one or more of glass and quartz, and the flexible substrate may be, but not limited to, one or more of polyethylene terephthalate. BHET, polyetheretherketone, polystyrene, polycarbonate, polyarylate, polyarylester, polyimide, polyvinyl chloride, polyethylene, and textile fibers. In an exemplary implementation, the flexible substrate may include a first flexible material layer, a first inorganic material layer, a semiconductor layer, a second flexible material layer and a second inorganic material layer which are stacked. Materials of the first flexible material layer and the second flexible material layer may adopt polyimide (PI), polyethylene terephthalate (PET) or surface-treated soft polymer film and other materials, materials of the first inorganic material layer and the second inorganic material layer may adopt silicon nitride (SiNx) or silicon oxide (SiOx) and the like, which are configured to improve water and oxygen resistance of the substrate, and the material of the semiconductor layer may adopt amorphous silicon (a-si).

In an exemplary embodiment, the first conductive layer, the second conductive layer, the third conductive layer, and the fourth conductive layer may adopt any one or more of metal materials, such as silver (Ag), copper (Cu), aluminum (Al), and molybdenum (Mo), or alloy materials of the above metal, such as an aluminum-neodymium alloy (AlNd) or a molybdenum-niobium alloy (MoNb), may be a single-layer structure, or a multi-layer composite structure, such as Mo/Cu/Mo. The first insulating layer, the second insulating layer, the third insulating layer and the fourth insulating layer may adopt any one or more of silicon oxide (SiOx), silicon nitride (SiNx) and silicon oxynitride (SiON), and may be a single layer, multiple layers or a composite layer. The first insulating layer is called a buffer layer, which is configured to improve the water and oxygen resistance of the substrate, the second insulating layer and the third insulating layer are called a gate insulating (GI) layer, and the fourth insulating layer is called an interlayer insulation (ILD) layer. The active layer may adopt an amorphous indium gallium zinc oxide (a-IGZO) material, zinc oxynitride (ZnON), indium zinc tin oxide (IZTO), amorphous silicon (a-Si), polycrystalline silicon (p-Si), sexithiophene or polythiophene and other materials, that is, the present disclosure is applicable to transistors manufactured based on an oxide technology, a silicon technology or an organic matter technology. The first insulating layer and the fourth insulating layer may adopt an organic material, such as resin. The fifth conductive layer may adopt a single-layer structure, such as indium tin oxide ITO or indium zinc oxide IZO, or may adopt a multi-layer composite structure, such as ITO/Ag/ITO. The pixel defining layer may adopt polyimide, acrylic or polyethylene terephthalate. The cathode may adopt any one or more of magnesium (Mg), silver (Ag), aluminum (Al), copper (Cu) and lithium (Li), or adopt an alloy manufactured by any one or more of the above metal.

Those skilled in the art will easily figure out other embodiments of the present disclosure after considering the specification and practicing the content disclosed here. The present application intends to cover any transformation, usage or adaptive change of the present disclosure, and these transformations, usages or adaptive changes conform to a general principle of the present disclosure and include common general knowledge or conventional technical means in the technical field not disclosed by the present disclosure. The specification and the embodiments are merely regarded as being for example, and the true scope and spirit of the present disclosure are indicated by claims.

It will be appreciated that the present disclosure is not limited to the exact structure that has been described above and shown in the accompanying drawings, and that various modifications and changes may be made without departing from the scope of the present disclosure. The scope of the present disclosure should still be defined by the appended claims.

What is claimed is:

1. A display substrate, comprising:

a base substrate; and a plurality of sub-pixels arranged in an array, wherein at least one of the plurality of sub-pixels comprises a pixel driving circuit and a light-emitting device, the plurality of sub-pixels form an array of M rows*N columns, and M and N are positive integers greater than or equal to 1; the pixel driving circuit comprises a plurality of transistors, and the plurality of transistors comprise driving transistors; and the light-emitting device comprises a first electrode;

wherein the base substrate comprises: a first initialization signal line and a second initialization signal line; and the first initialization signal line and the second initialization signal line extend in a first direction, and the first direction is an extension direction of sub-pixel rows;

the first initialization signal line is respectively electrically connected with a $m^{th}$ row of sub-pixels, and is configured to transmit a first initialization signal to a control electrode of a driving transistor of the $m^{th}$ row of sub-pixels; and the second initialization signal line is respectively electrically connected with a $(m-1)^{th}$ row of sub-pixels, and is configured to transmit a second initialization signal to a first electrode of a light-emitting device of the $(m-1)^{th}$ row of sub-pixels;

in a second direction, a projection of the first initialization signal line on the base substrate is located on one side of a projection of the second initialization signal line on the base substrate close to a projection of the $(m-1)^{th}$ row of sub-pixels on the base substrate, the second direction is an extension direction of sub-pixel columns, and m is a positive integer greater than or equal to 1 and less than or equal to M; and the first initialization signal is different from the second initialization signal;

wherein in the second direction, the first initialization signal line and the second initialization signal line are both located between driving transistors of adjacent two rows of sub-pixels, and located on a same side of driving transistors of any row of the adjacent two rows of sub-pixels; and a minimum width of the second initialization signal line in the second direction is greater than a minimum width of first initialization signal line in the second direction;

wherein the display substrate further comprises a third initialization signal line extending in the second direction;

wherein based on that the plurality of sub-pixels comprise a plurality of first electrodes, an orthographic projection of at least one of the plurality of first electrodes on the base substrate overlaps with an orthographic projection of the third initialization signal line on the base substrate;

wherein the plurality of sub-pixels comprise red sub-pixels emitting red light, blue sub-pixels emitting blue light, and green sub-pixels emitting green light, and the plurality of sub-pixel columns comprise red-blue pixel columns and green pixel columns; the red-blue pixel columns comprise the red sub-pixels and the blue sub-pixels disposed alternately in the second direction; the green pixel columns comprise the green sub-pixels disposed in sequence in the second direction; and wherein the third initialization signal line is only located in the red-blue pixel columns, or the third initialization signal line is only located in the green pixel columns.

2. The display substrate according to claim 1, wherein in the second direction, the minimum width of the second initialization signal line is 1.3-2.4 times the minimum width of the first initialization signal line.

3. The display substrate according to claim 1, further comprising:

a reset signal line, wherein the reset signal line extends in the first direction and is configured to transmit a reset signal to the pixel driving circuit;

the plurality of transistors further comprise: a first reset transistor and a second reset transistor; and the first reset transistor is configured to transmit the first initialization signal on the first initialization signal line to the control electrode of the driving transistor of the $m^{th}$ row of sub-pixels under control of the reset signal; and the second reset transistor is configured to transmit the second initialization signal on the second initialization signal line to the first electrode of the light-emitting device of the $(m-1)^{th}$ row of sub-pixels under control of the reset signal.

4. The display substrate according to claim 3, wherein in the second direction, the reset signal line, the second initialization signal line, and the first initialization signal line are arranged in sequence in a direction away from the driving transistor of the $m^{th}$ row of sub-pixels.

5. The display substrate according to claim 1, wherein in a direction perpendicular to the display substrate, a driving circuit layer of each of the plurality of sub-pixels comprises a semiconductor layer, a first conductive layer, a second conductive layer, a third conductive layer and a fourth conductive layer disposed on the base substrate in sequence; and the semiconductor layer comprises an active layer of the plurality of transistors, and the active layer comprises channel regions and source-drain regions of the plurality of transistors; the first conductive layer comprises a reset signal line and control electrodes of the plurality of transistors; the second conductive layer comprises the first initialization signal line and the second initialization signal line; and the third conductive layer comprises a first power supply line, and the fourth conductive layer comprises a second power supply line and a data signal line.

6. The display substrate according to claim 5, wherein the third initialization signal line and the first initialization signal line are disposed in different layers, and the third initialization signal line is electrically connected with the first initialization signal line or the second initialization signal line.

7. The display substrate according to claim 6, wherein the third conductive layer further comprises the third initialization signal line.

8. The display substrate according to claim 6, wherein the third initialization signal line and the first initialization signal line are electrically connected and distributed in a mesh shape.

9. The display substrate according to claim 8, wherein at least one column of sub-pixels is arranged between adjacent third initialization signal lines.

10. The display substrate according to claim 9, wherein at least two first power supply lines are disposed between the adjacent third initialization signal lines.

11. The display substrate according to claim 5, wherein the plurality of transistors further comprise: a second transistor, a first pole of the second transistor is electrically connected with a second pole of the driving transistor, and a second pole of the second transistor is electrically connected with the control electrode of the driving transistor; and the second conductive layer further comprises a shielding portion electrically connected with the first power supply line, a projection of the shielding portion on the base substrate covers at least part of a source-drain region of the second transistor, and the projection of the shielding portion on the base substrate and a projection of the data signal line on the base substrate are located between projections of adjacent data signal lines on the base substrate.

12. The display substrate according to claim 5, wherein the third conductive layer further comprises a fourth connection portion and a fifth connection portion, the fourth conductive layer further comprises a seventh connection portion, the seventh connection portion is electrically connected with the fourth connection portion and the fifth connection portion, and the fourth connection portion and the fifth connection portion are different in shape.

13. The display substrate according to claim 1, wherein when the third initialization signal line is only located in the red-blue pixel columns, a shape of the third initialization signal line electrically connected with a $n^{th}$ column of red-blue pixel columns is roughly the same as a shape of the third initialization signal line electrically connected with a $(n+1)^{th}$ column of red-blue pixel columns, and n is a positive integer greater than or equal to 1 and less than or equal to N.

14. The display substrate according to claim 13, wherein the third initialization signal line comprises a first extension portion, a second extension portion and a third extension portion connected in sequence in the second direction, the first extension portion extends in the second direction and is electrically connected with the first initialization signal line through a via hole, an extension direction of the third extension portion is different from an extension direction of the first extension portion, the second extension portion is configured to connect the first extension portion with the third extension portion, and an extension direction of the second extension portion deviates from the second direction.

15. The display substrate according to claim 14, wherein a projection of the first extension portion on the base substrate has an overlapped region with projections of the reset signal line, the first initialization signal line and the second initialization signal line on the base substrate.

16. The display substrate according to claim 15, wherein the first extension portion is connected with a first pole of a first transistor through a via hole.

17. The display substrate according to claim 14, wherein, the second extension portion and the first extension portion form an angle greater than 90° and less than 180°; and the third extension portion and the second extension portion form an angle greater than 90° and less than 180°.

18. A display apparatus, comprising a display substrate, wherein the display substrate comprises:

a base substrate; and a plurality of sub-pixels arranged in an array, wherein at least one of the plurality of sub-pixels comprises a pixel driving circuit and a light-emitting device, the plurality of sub-pixels form an array of M rows*N columns, and M and N are positive integers greater than or equal to 1; the pixel driving circuit comprises a plurality of transistors, and the plurality of transistors comprise driving transistors; and the light-emitting device comprises a first electrode;

wherein the base substrate comprises: a first initialization signal line and a second initialization signal line; and the first initialization signal line and the second initialization signal line extend in a first direction, and the first direction is an extension direction of sub-pixel rows;

the first initialization signal line is respectively electrically connected with a $m^{th}$ row of sub-pixels, and is configured to transmit a first initialization signal to a control electrode of a driving transistor of the $m^{th}$ row of sub-pixels; and the second initialization signal line is respectively electrically connected with a $(m-1)^{th}$ row of sub-pixels, and is configured to transmit a second initialization signal to a first electrode of a light-emitting device of the $(m-1)^{th}$ row of sub-pixels;

in a second direction, a projection of the first initialization signal line on the base substrate is located on one side of a projection of the second initialization signal line on the base substrate close to a projection of the $(m-1)^{th}$ row of sub-pixels on the base substrate, the second direction is an extension direction of sub-pixel columns, and m is a positive integer greater than or equal to 1 and less than or equal to M; and the first initialization signal is different from the second initialization signal;

wherein in the second direction, the first initialization signal line and the second initialization signal line are both located between driving transistors of adjacent two rows of sub-pixels, and located on a same side of driving transistors of any row of the adjacent two rows of sub-pixels; and a minimum width of the second initialization signal line in the second direction is greater than a minimum width of first initialization signal line in the second direction;

wherein the display substrate further comprises a third initialization signal line extending in the second direction;

wherein based on that the plurality of sub-pixels comprise a plurality of first electrodes, an orthographic projection of at least one of the plurality of first electrodes on the base substrate overlaps with an orthographic projection of the third initialization signal line on the base substrate;

wherein the plurality of sub-pixels comprise red sub-pixels emitting red light, blue sub-pixels emitting blue light, and green sub-pixels emitting green light, and the plurality of sub-pixel columns comprise red-blue pixel columns and green pixel columns; the red-blue pixel columns comprise the red sub-pixels and the blue sub-pixels disposed alternately in the second direction; the green pixel columns comprise the green sub-pixels disposed in sequence in the second direction; and wherein the third initialization signal line is only located in the red-blue pixel columns, or the third initialization signal line is only located in the green pixel columns.

19. A display substrate, comprising:

a base substrate; and a plurality of sub-pixels arranged in an array, wherein at least one of the plurality of sub-pixels comprises a pixel driving circuit and a light-emitting device, the plurality of sub-pixels form an array of M rows*N columns, and M and N are positive integers greater than or equal to 1; the pixel driving circuit comprises a plurality of transistors, and the plurality of transistors comprise driving transistors; and the light-emitting device comprises a first electrode;

wherein the base substrate comprises: a first initialization signal line and a second initialization signal line; and the first initialization signal line and the second initialization signal line extend in a first direction, and the first direction is an extension direction of sub-pixel rows;

the first initialization signal line is respectively electrically connected with a $m^{th}$ row of sub-pixels, and is configured to transmit a first initialization signal to a control electrode of a driving transistor of the $m^{th}$ row of sub-pixels; and the second initialization signal line is respectively electrically connected with a $(m-1)^{th}$ row of sub-pixels, and is configured to transmit a second initialization signal to a first electrode of a light-emitting device of the $(m-1)^{th}$ row of sub-pixels;

in a second direction, a projection of the first initialization signal line on the base substrate is located on one side of a projection of the second initialization signal line on the base substrate close to a projection of the $(m-1)^{th}$ row of sub-pixels on the base substrate, the second direction is an extension direction of sub-pixel columns, and m is a positive integer greater than or equal to 1 and less than or equal to M; and the first initialization signal is different from the second initialization signal;

wherein in the second direction, the first initialization signal line and the second initialization signal line are both located between driving transistors of adjacent two rows of sub-pixels, and located on a same side of driving transistors of any row of the adjacent two rows of sub-pixels; and a minimum width of the second initialization signal line in the second direction is greater than a minimum width of first initialization signal line in the second direction;

wherein the display substrate further comprises a third initialization signal line extending in the second direction;

wherein based on that the plurality of sub-pixels comprise a plurality of first electrodes, an orthographic projection of at least one of the plurality of first electrodes on the base substrate overlaps with an orthographic projection of the third initialization signal line on the base substrate;

wherein the plurality of sub-pixels comprise a first color sub-pixel, a second color sub-pixel and a third color sub-pixel emitting light with different colors; the orthographic projection of the third initialization signal line on the base substrate overlaps with an orthographic projection of a first electrode of the first color sub-pixel on the base substrate and an orthographic projection of a first electrode of the second color sub-pixel on the base substrate; and an area of the first color sub-pixel is different from an area of the second color sub-pixel;

wherein the first color sub-pixel is a red sub-pixel, and the second sub-pixel is a blue sub-pixel;

wherein the third initialization signal line is connected to the first initialization signal line through a via hole, and an orthographic projection of the via hole on the base substrate does not overlap with the orthographic projection of the first electrode of the red sub-pixel on the base substrate and the orthographic projection of the first electrode the blue sub-pixel on the base substrate.

* * * * *